(12) United States Patent
Song et al.

(10) Patent No.: US 9,026,975 B2
(45) Date of Patent: May 5, 2015

(54) SEMICONDUCTOR INTEGRATED CIRCUIT, METHOD OF DESIGNING THE SAME, AND METHOD OF FABRICATING THE SAME

(71) Applicants: Tae-joong Song, Seongnam-si (KR); Pil-un Ko, Hwaseong-si (KR); Gyu-hong Kim, Seoul (KR); Jong-hoon Jung, Seoul (KR)

(72) Inventors: Tae-joong Song, Seongnam-si (KR); Pil-un Ko, Hwaseong-si (KR); Gyu-hong Kim, Seoul (KR); Jong-hoon Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/800,483

(22) Filed: Mar. 13, 2013

(65) Prior Publication Data

US 2014/0001564 A1    Jan. 2, 2014

(30) Foreign Application Priority Data

Jun. 27, 2012    (KR) .................. 10-2012-0069473

(51) Int. Cl.
G06F 17/50    (2006.01)
H01L 27/092    (2006.01)
H01L 27/02    (2006.01)

(52) U.S. Cl.
CPC ........ G06F 17/5072 (2013.01); G06F 17/5081 (2013.01); G06F 17/50 (2013.01); H01L 27/092 (2013.01); G06F 17/5077 (2013.01); H01L 27/0207 (2013.01); H01L 27/0924 (2013.01)

(58) Field of Classification Search
CPC ............ G06F 17/5072; G06F 17/5077; G06F 17/5081
USPC .......... 716/124, 122, 131, 129, 130, 132, 54, 716/55; 703/14
See application file for complete search history.

(56) References Cited

U.S. PATENT DOCUMENTS

| | | |
|---|---|---|
| 5,635,744 A | 6/1997 | Hidaka et al. |
| 6,874,132 B1 | 3/2005 | Bhamidipaty |
| 7,093,215 B2 | 8/2006 | Sahara et al. |
| 7,290,234 B2 | 10/2007 | Shibayama |
| 7,462,914 B2 | 12/2008 | Sahara et al. |
| 7,523,419 B2 | 4/2009 | Furuki |
| 7,533,358 B2 | 5/2009 | Gopalakrishnan et al. |

(Continued)

FOREIGN PATENT DOCUMENTS

| | | | | |
|---|---|---|---|---|
| JP | 59210674 A | * | 11/1984 | ............. H01L 29/80 |
| JP | 62120697 A | * | 6/1987 | ............. G11C 11/34 |

(Continued)

*Primary Examiner* — Phallaka Kik
(74) *Attorney, Agent, or Firm* — Sughrue Mion, PLLC

(57) ABSTRACT

A semiconductor integrated circuit designing method capable of minimizing a parasitic capacitance generated by an overhead in conductive lines, especially a gate line, a semiconductor integrated circuit according to the designing method, and a fabricating method thereof are provided. A method of designing a semiconductor integrated circuit having a FinFET architecture, includes: performing a pre-simulation of the semiconductor integrated circuit to be designed; designing a layout of components of the semiconductor integrated circuit based on a result of the pre-simulation, the components comprising first and second device areas and a first conductive line extending across the first and second device areas; modifying a first cutting area, that is arranged between the first and second device areas and electrically cuts the first conductive line, according to at least one design rule to minimize an overhead of the first conductive line created by the first cutting area.

25 Claims, 22 Drawing Sheets

(56) References Cited

U.S. PATENT DOCUMENTS

| | | | |
|---|---|---|---|
| 7,826,738 B2 * | 11/2010 | Higuchi et al. | 396/310 |
| 8,091,052 B2 | 1/2012 | Rewienski et al. | |
| 8,381,147 B2 * | 2/2013 | Lu | 716/106 |
| 2007/0143723 A1 | 6/2007 | Kawakami | |
| 2008/0170272 A1 * | 7/2008 | Higuchi et al. | 358/444 |
| 2011/0057685 A1 | 3/2011 | Noguchi | |
| 2011/0144968 A1 | 6/2011 | Naruta | |
| 2012/0311518 A1 * | 12/2012 | Lu | 716/124 |

FOREIGN PATENT DOCUMENTS

| | | | | | |
|---|---|---|---|---|---|
| JP | 02308553 A | * | 12/1990 | | H01L 21/90 |
| JP | 03185863 A | * | 8/1991 | | H01L 27/12 |
| JP | 2004-13821 A | | 1/2004 | | |
| JP | 2006-227733 A | | 8/2006 | | |
| JP | 2011-222747 A | | 11/2011 | | |
| KR | 10-0567069 B1 | | 4/2006 | | |
| KR | 10-2009-0066924 A | | 6/2009 | | |
| KR | 10-2009-0108390 A | | 10/2009 | | |

* cited by examiner

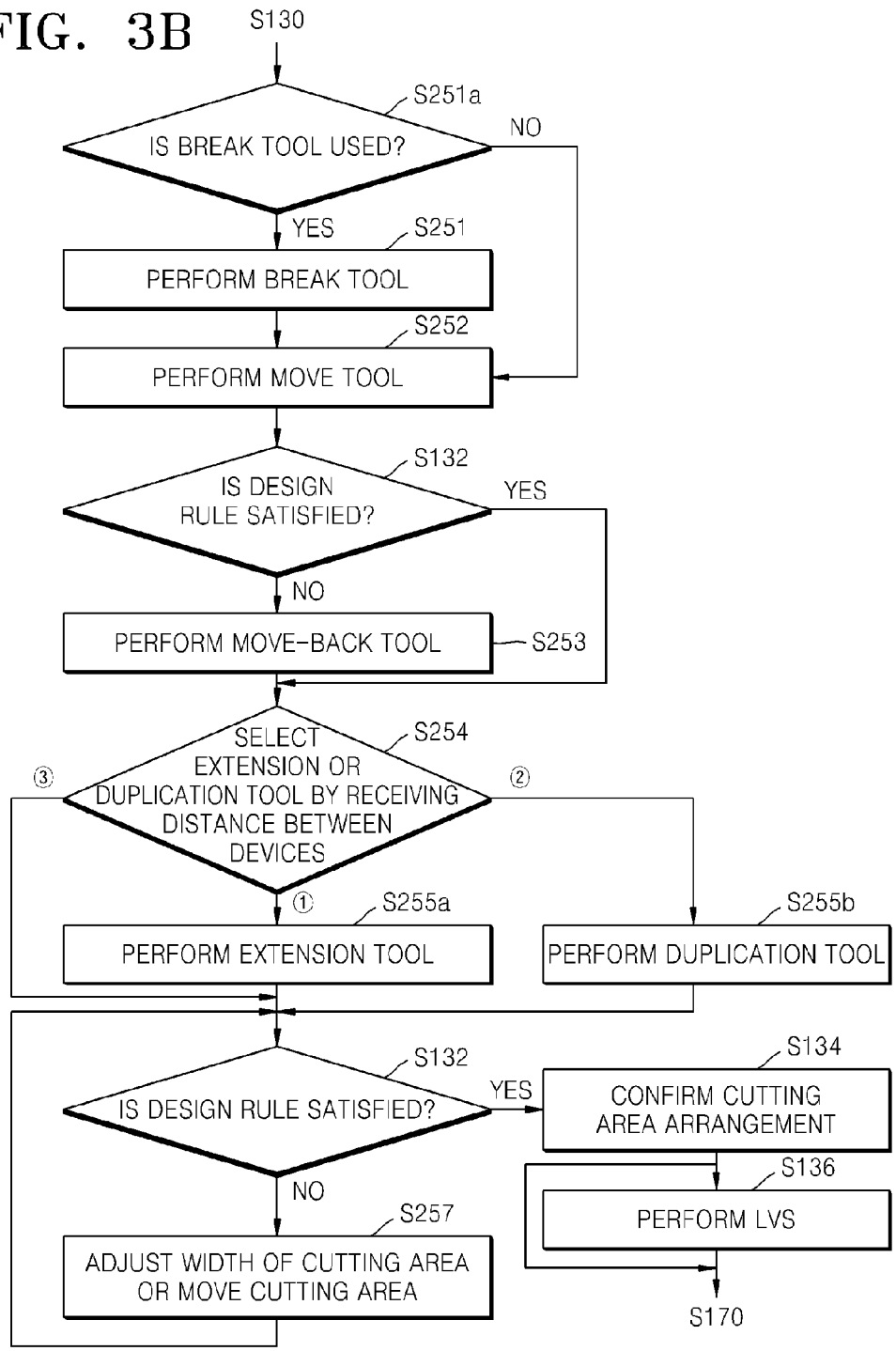

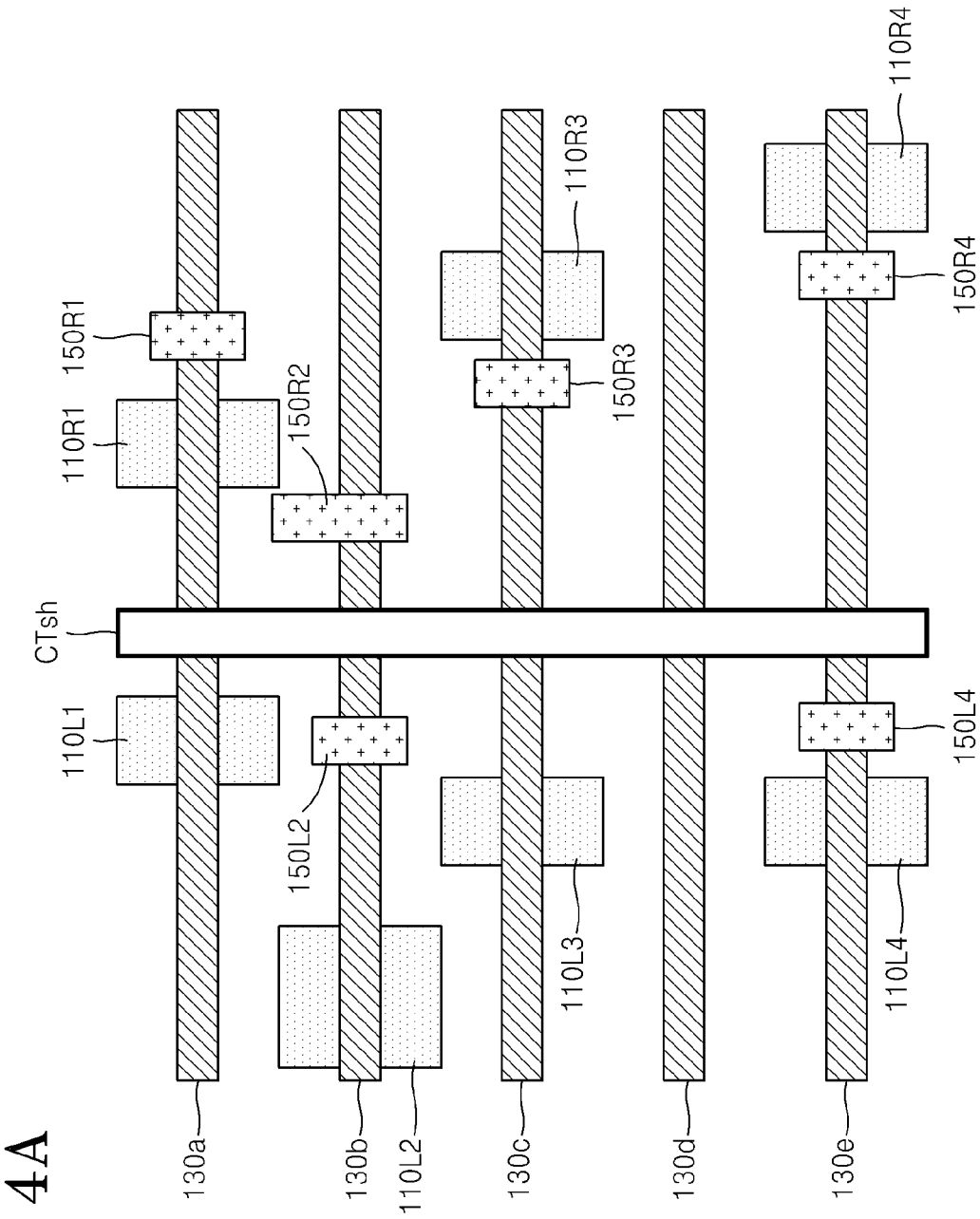

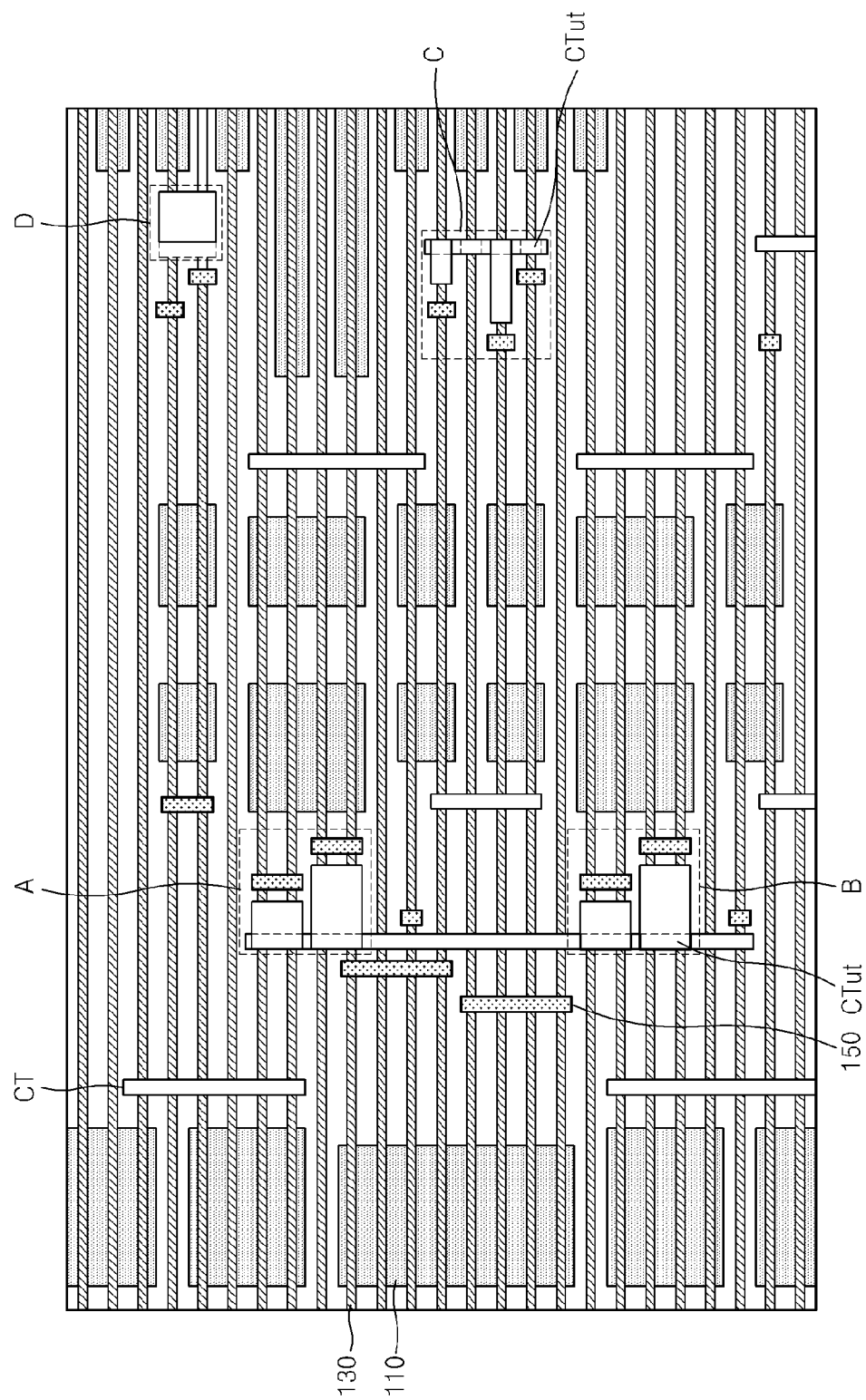

SEMICONDUCTOR INTEGRATED CIRCUIT, METHOD OF DESIGNING THE SAME, AND METHOD OF FABRICATING THE SAME

CROSS-REFERENCE TO RELATED APPLICATIONS

This application claims the benefit of Korean Patent Application No. 10-2012-0069473, filed on Jun. 27, 2012 in the Korean Intellectual Property Office, the disclosure of which is incorporated herein in its entirety by reference.

BACKGROUND

1. Field

Exemplary embodiments relate to a semiconductor integrated circuit, and more particularly, to a method of designing a semiconductor integrated circuit, a semiconductor integrated circuit according to the designing method, and a fabricating method thereof.

2. Description of the Related Art

A semiconductor device is provided in a module form with several circuits required for an operation. This module is a unit having an independent function as a part forming a single system. A process of designing a layout of circuit patterns to meet the nature of a corresponding semiconductor chip according to a design rule precedes fabrication of a semiconductor device. Recently, a change in the design rule causes designing conductive lines, especially a gate line, in a layout of a semiconductor integrated circuit to be a very important consideration.

SUMMARY

One or more exemplary embodiments provide a semiconductor integrated circuit designing method capable of minimizing a parasitic capacitance generated by an overhead in conductive lines, especially a gate line, a semiconductor integrated circuit according to the designing method, and a fabricating method thereof.

One or more exemplary embodiments also provide a semiconductor integrated circuit designing method capable of automatically minimizing an overhead in a gate without modifying a design rule or applying an additional Optical Proximity Correction (OPC) rule.

According to an aspect of an exemplary embodiment, there is provided a method of designing a semiconductor integrated circuit having a FinFET architecture, the method comprising: performing a pre-simulation of the semiconductor integrated circuit to be designed; designing a layout of components of the semiconductor integrated circuit based on a result of the pre-simulation, the components comprising first and second device areas and a first conductive line extending across the first and second device areas; modifying a first cutting area, that is arranged between the first and second device areas and electrically cuts the first conductive line, according to at least one design rule to minimize an overhead of the first conductive line created by the first cutting area.

The overhead may be minimized to reduce a parasitic capacitance of the first conductive line.

The modifying the first cutting area may include at least one of: moving the first cutting area along the first conductive line, extending a width of the first cutting area, and duplicating the first cutting area to create a second cutting area and arranging the second cutting area along the first conductive line.

The method moving the first cutting area may include moving the first cutting area along the first conductive line based on a predetermined distance between the first cutting area and one of the first and second device areas.

The design rule may specify at least one of a minimum distance separating the first cutting area from the first and second device areas, a minimum distance separating the first cutting area from a contact area, and a minimum distance separating the first cutting area from a third device area.

The first cutting area may cut a plurality of conductive lines including the first conductive line and extending in parallel to each other, and the method may further include, prior to the modifying the first cutting area, breaking the first cutting area into a plurality of cutting areas, each of the plurality of cutting areas cutting a respective conductive line of the plurality of conductive lines.

The modifying the first cutting area may include modifying the plurality of cutting areas according to the at least one design rule to minimize overheads of the plurality of conductive lines created by the plurality of cutting areas, and the modified cutting areas may have at least one of different widths and different positions along the respective conductive lines.

The modifying the first cutting area may include: moving the first cutting area in a first direction along the first conductive line so that the first cutting area is a preset distance from the first device area according to the design rule; and moving the first cutting area in a second direction opposite to the first direction when a distance between the first cutting area and a contact area or a device area other than the first and second device areas violates the design rule as a result of the moving the first cutting area in the first direction.

According to an aspect of another exemplary embodiment, there is provided a method of designing a semiconductor integrated circuit having a FinFET architecture, the method including: setting a first cutting area of a first conductive line extending across first and second device areas at an initial position between the first and second device areas on the first conductive line according to a design rule, the first cutting area electrically cutting the first conductive line; and extending a width of the first cutting area, or duplicating the first cutting area and arranging a second cutting area that is duplicate of the first cutting area on the first conductive line, to minimize an overhead in the first conductive line created by the first cutting area.

The method may further include, after the setting the setting the first cutting area, moving the first cutting area in a first direction along the first conductive line so that the first cutting area is a preset distance from the first device area according to the design rule.

The method may further include, after the moving the first cutting area in the first direction, moving the first cutting area in a second direction opposite to the first direction when a distance between the first cutting area and a contact area or a device area other than the first and second device areas violates the design rule as a result of the moving the first cutting area in the first direction.

The first cutting area may cut a plurality of conductive lines including the first conductive line and extending in parallel to each other, and the method may further include, prior to the moving the first cutting area in the first direction, breaking the first cutting area into a plurality of cutting areas, each of the plurality of cutting areas cutting a respective conductive line of the plurality of conductive lines.

The extending the width of the first cutting area or the duplicating the first cutting area and arranging the second cutting area may include: determining whether to perform the extending the width of the first cutting area or the duplicating the first cutting area and arranging the second cutting area, based on a distance between the first and second device areas; performing the extending the width of the first cutting area or the duplicating the first cutting area and arranging the second cutting area based on a result of the determining; verifying that the extending width of the first cutting area or the duplicating the first cutting area and arranging the second cutting area satisfies the design rule; and if the extending width of the first cutting area is performed and does not satisfy the design rule, adjusting the width of the first cutting area so that the design rule is satisfied; and if the duplicating the first cutting area and arranging the second cutting area does not satisfy the design rule, moving at least one of the first and second cutting areas so that the design rule is satisfied.

The design rule may specify at least one of a minimum distance separating the first and second cutting areas from the first and second device areas, a minimum distance separating the first and second cutting areas from contact areas, and a minimum distance separating the first and second cutting areas from a third device area.

The determining whether to perform the extending the width of the first cutting area may include determining that the extending the width of the first cutting area is to be performed if a total distance (Dtot) between the first and second device areas satisfies the following equation: $Ds*2+W1<Dtot\leq Ds*2+W1*3$, wherein Ds is the preset distance between the first cutting area and the first and second device areas, and W1 is the width of the first cutting area.

The determining whether to perform the duplicating the first cutting area and arranging the second cutting area may include determining whether a total distance between the first and second device areas (Dtot) satisfies the following equation: $Dtot\geq Ds*2+W1*3$, wherein Ds is the preset distance between the first cutting area and the first and second device areas, and W1 is the width of the first cutting area According to an aspect of another exemplary embodiment there is provided a method of manufacturing a semiconductor integrated circuit having a FinFET architecture, the method including: performing a pre-simulation of the semiconductor integrated circuit to be designed; designing a layout of components of the semiconductor integrated circuit based on a result of the pre-simulation, the components comprising first and second device areas and a first conductive line extending across the first and second device areas; modifying a first cutting area, that is arranged between the first and second device areas and electrically cuts the first conductive line, according to at least one design rule to minimize an overhead of the first conductive line created by the first cutting area; performing a post-simulation based on the layout including the modified first cutting area; and fabricating the semiconductor integrated circuit based on the layout.

The fabricating the semiconductor integrated circuit may include: preparing data of the layout; performing optical proximity correction to produce a corrected layout in which reflecting errors due to an optical proximity effect are corrected; producing a mask according to the corrected layout; and forming the semiconductor integrated circuit on a wafer using the mask.

The overhead may be minimized to reduce a parasitic capacitance of the first conductive line.

The modifying the first cutting area may include at least one of: moving the first cutting area along the first conductive line, extending a width of the first cutting area, and duplicating the first cutting area to create a second cutting area and arranging the second cutting area along the first conductive line.

The modifying the first cutting area may include moving the first cutting area along the first conductive line based on a predetermined distance between the first cutting area and one of the first and second device areas.

The design rule may specify at least one of a minimum distance separating the first cutting area from the first and second device areas, a minimum distance separating the first cutting area from contact areas arranged between the first and second device areas, and a minimum distance separating the first cutting area from a third device area.

The first cutting area may cut a plurality of conductive lines including the first conductive line and extending in parallel to each other, and wherein the method may further include, prior to the modifying the first cutting area, breaking the first cutting area into a plurality of cutting areas, each of the plurality of cutting areas cutting a respective conductive line of the plurality of conductive lines.

According to an aspect of another exemplary embodiment, there is provided a semiconductor integrated circuit including: at least first and second semiconductor devices having a FinFET architecture and arranged in a first line direction, wherein the first semiconductor device comprises at least a first active area and the second semiconductor comprises at least a second active area; and a first conductive line that extends in the first line direction across the first active area of the first semiconductor device and the second active area of the second semiconductor device; a second conductive line that extends in the first line direction across the first active area of the first semiconductor device and the second active area of the second semiconductor device; and a first cutting area that electrically cuts the first conductive line between the first and second active areas; and a second cutting area that electrically cuts the second conductive line between the first and second active areas, wherein the first cutting area and the second cutting area have at least one of different widths and different positions in the first line direction along the respective first and second conductive lines, which are set to satisfy a design rule and minimize an overhead of the first conductive line created by the first cutting area and an overhead of the second conductive line created by the second cutting area.

The overheads may be minimized to reduce a parasitic capacitance of the first and second conductive lines.

Each of the first semiconductor devices may include a plurality of active areas forming an NMOS transistor or a PMOS transistor, and the first and second conductive lines may be gate lines.

The design rule may specify at least one of a minimum distance separating the first and second cutting areas from the first and second active areas, and a minimum distance separating the first and second cutting areas from contact areas arranged between the first and second active areas.

According to another aspect of another exemplary embodiment, there is provided a computer-readable recording medium storing a computer-readable program that when executed by a computer performs the methods of designing the semiconductor integrated circuit.

BRIEF DESCRIPTION OF THE DRAWINGS

Exemplary embodiments will be more clearly understood from the following detailed description taken in conjunction with the accompanying drawings in which:

FIGS. 3A to 3C are flowcharts showing in more detail operation S150 (arranging a cutting area using an arrangement process) in the method of FIG. 1, according to exemplary embodiments;

FIGS. 4A to 4F are top views for showing that a method of arranging a cutting area using the arrangement process is applied to a layout design in the method of FIG. 1;

FIGS. 6A and 6B are top views for showing that the method of FIG. 1 is applied to an actual layout of a semiconductor integrated circuit;

DETAILED DESCRIPTION OF THE EMBODIMENTS

Figure 1:
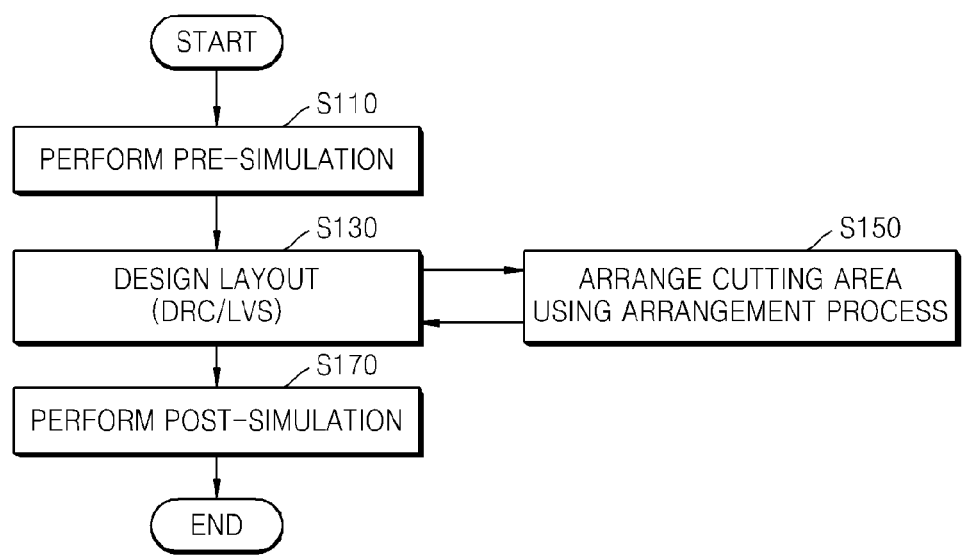
FIG. 1 is a flowchart illustrating a method of designing a semiconductor integrated circuit according to an exemplary embodiment.

Exemplary embodiments will now be described in detail with reference to the accompanying drawings. The exemplary embodiments are provided to describe the inventive concept more fully to those of ordinary skill in the art. The exemplary embodiments may, however, be embodied in many different forms and should not be construed as being limited to the exemplary embodiments set forth herein; rather, these exemplary embodiments are provided so that this disclosure will be thorough and complete, and will fully convey the concept to those of ordinary skill in the art.

In the description below, when it is described that a certain component is connected to another component, the certain component may be directly connected to another component, or a third component may be interposed therebetween. Similarly, when it is described that a certain component is above another component, the certain component may be directly above another component, or a third component may be interposed therebetween. In the drawings, the structures or sizes of components are exaggerated for convenience and clarity of description, and parts irrelevant to the description are omitted. Like reference numerals in the drawings denote like elements. The terminology used herein is for the purpose of describing the inventive concept only and is not intended to be limiting of the meaning or the scope of the inventive concept as defined by the appended claims.

As used herein, the term "and/or" includes any and all combinations of one or more of the associated listed items. Expressions such as "at least one of," when preceding a list of elements, modify the entire list of elements and do not modify the individual elements of the list.

FIG. 1 is a flowchart illustrating a method of designing a semiconductor integrated circuit according to an exemplary embodiment.

Referring to FIG. 1, in operation S110, a pre-simulation of a semiconductor integrated circuit to be designed is performed. The pre-simulation may include High Level Description (HLD), Register Transfer Language (RTL) coding, synthesis, Gate Level Simulation (GLS), etc. The HLD may indicate that a computer program is performed with a high-level language such as a C language. The RTL coding may indicate that a design is performed using a language describing hardware, such as a Hardware Description Language (HDL). The synthesis may indicate a process of converting an RTL code to a Netlist in a gate level using a synthesis tool. The GLS is a simulation for verifying whether synthesis is well performed, which is generally achieved through Static Timing Analysis (STA), and a test vector may be considered together.

Next, in operation S130, a layout design is performed. The layout design is a process of arranging cells and connecting wirings therebetween based on a design rule and is also called a Place and Routing (P&R) process. The design rule may indicate a minimum measure, which is a criterion of a design in physical circuit structures.

Operation S130 may include performing Design Rule Check (DRC) and performing Layout Versus Schematic (LVS). The DRC is a process of checking whether a layout is successfully completed with a physical measure space according to the design rule after the layout is completed, and the LVS is a process of checking whether the layout meets a corresponding circuit diagram. In addition, operation S130 may further include performing Electric Rule Check (ERC) for checking whether devices and wirings are electrically well connected therebetween.

In operation S150, which may be performed after or at the same time as operation S130, a cutting area is arranged using an arrangement process. The cutting area indicates an area cutting a conductive line, such as a gate line. The semiconductor integrated circuit designing method according to the current exemplary embodiment may automatically optimize and arrange the cutting area using the arrangement process in the layout design, thereby minimizing an overhead in the gate line and accordingly minimizing the generation of a parasitic capacitance. Details of the cutting area arrangement using the arrangement process will be described with reference to FIG. 3A and below.

Figure 7:
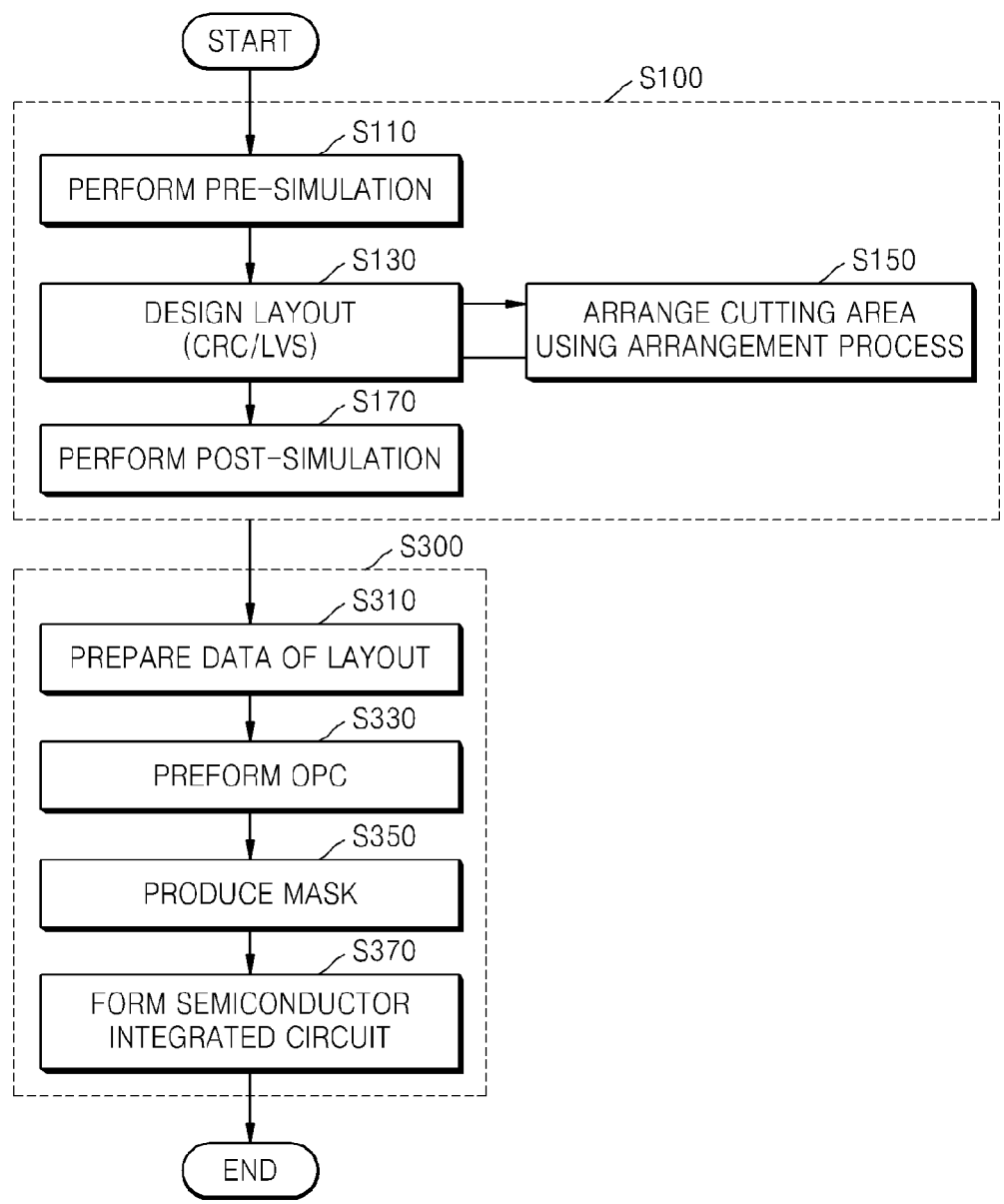
FIG. 7 is a flowchart illustrating a method of fabricating a semiconductor integrated circuit according to an exemplary embodiment.

If the layout of the semiconductor integrated circuit is finally completed by performing the cutting area arrangement using the arrangement process in operation S150, then a post-simulation is performed in operation S170. The post-simulation may be a process of checking the functional completeness of a layout by extracting and simulating a parasitic component, such as a parasitic capacitance, after the layout is completed. Operations performed prior to the performing of the post-simulation may be generally called an operation of designing a semiconductor integrated circuit. After the designing operation, a semiconductor integrated circuit may be fabricated through a processing operation. Details of the processing operation will be described later with reference to FIG. 7 showing a flowchart of a process of fabricating a semiconductor integrated circuit.

The semiconductor integrated circuit designing method according to the current exemplary embodiment may automatically optimize and arrange the cutting area using the arrangement process in the layout design, thereby correctly and easily arranging the cutting area without defining an additional design rule or applying an additional Optical Proximity Correction (OPC) rule. The optimized arrangement of the cutting area may minimize an overhead in the gate line and accordingly minimize the generation of a parasitic capacitance.

FIGS. 2A to 2E are top views for describing location relationships between a cutting area cutting a conductive line and other device areas.

Figure 2A:
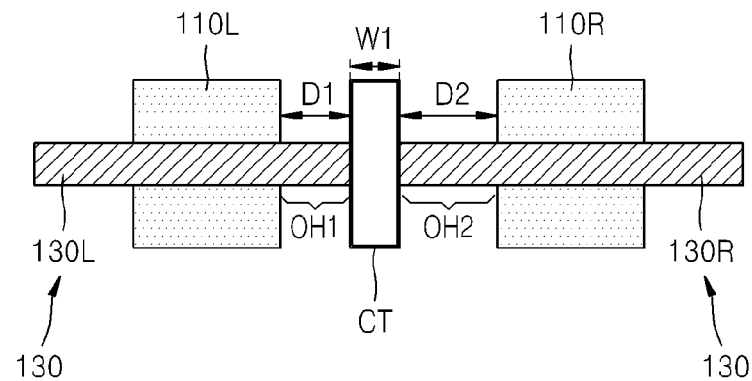
FIGS. 2A to 2E are top views for describing location relationships between a cutting area cutting a conductive line and other device areas.

Referring to FIG. 2A, in a semiconductor integrated circuit, a conductive line, e.g., a gate line 130, may be formed to cross two (left and right) active areas 110L and 110R. The gate line 130 may be cut into a left gate line 130L and a right gate line 130R by a cutting area CT according to a function of the semiconductor integrated circuit. The cutting area CT may be arranged on the gate line 130 to meet a design rule between the two active areas 110L and 110R. Thus, only if a first distance D1 between the cutting area CT and the left active area 110L, a second distance D2 between the cutting area CT and the right active area 110R, and a first width W1 indicating a width of the cutting area CT satisfy the design rule, the cutting area CT may be arranged at a location on the gate line 30 regardless of whatever the first distance D1 and the second distance D2 are. As such, when the cutting area CT is arranged only to satisfy the design rule, a portion of the gate line 130, which excessively protrudes from the two active areas 110L and 110R, i.e., an overhead portion OH1 of the left active area 110L and an overhead portion OH2 of the right active area 110R, may be a significant cause of the generation of a parasitic capacitance.

For example, in FIG. 2A, the second distance D2 is greater than the first distance D1, and accordingly, a parasitic capacitance of the overhead portion OH2 of the right active area 110R, which protrudes from the right active area 110R, may be greater than a parasitic capacitance of the overhead portion OH1 of the left active area 110L, which protrudes from the left active area 110L.

Figure 2B:
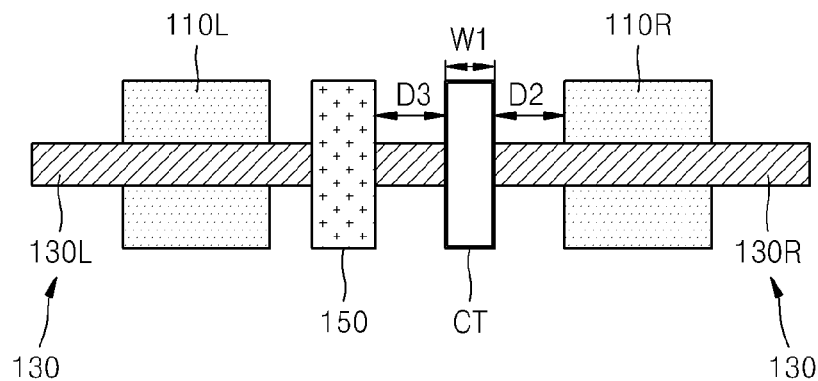

Referring to FIG. 2B, in a semiconductor integrated circuit, a gate line 130 may be formed to cross two (left and right) active areas 110L and 110R. The gate line 130 may be cut into a left gate line 130L and a right gate line 130R by a cutting area CT according to a function of the semiconductor integrated circuit. In addition, a contact area 150 may be formed on any one of the two gate lines 130L and 130R, e.g., the right end of the left gate line 130L, to provide a signal input and output of the gate line 130.

As such, when the contact area 150 is formed, the cutting area CT may be arranged between the contact area 150 and the right gate line 130R while satisfying the design rule. However, a third distance D3 between the cutting area CT and the contact area 150 and/or a second distance D2 between the cutting area CT and the right active area 110R may be longer than the minimum distance allowed by the design rule. Accordingly, an unnecessary parasitic capacitance may be still generated.

Figure 2C:
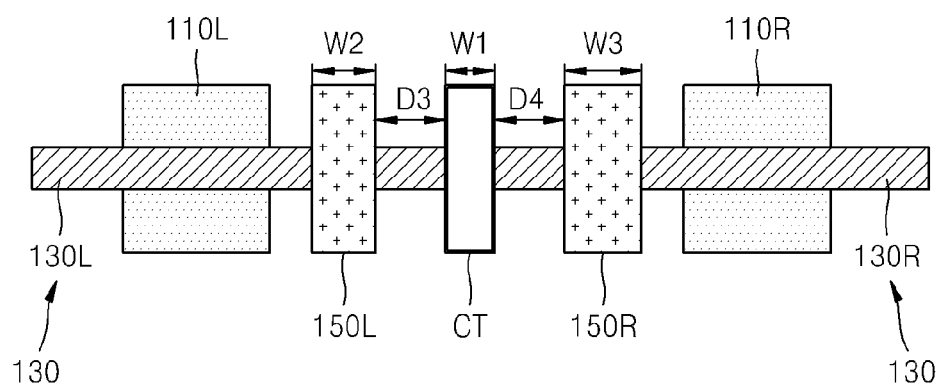

Referring to FIG. 2C, in a semiconductor integrated circuit, a gate line 130 may be formed to cross two (left and right) active areas 110L and 110R. The gate line 130 may be cut into a left gate line 130L and a right gate line 130R by a cutting area CT according to a function of the semiconductor integrated circuit. In addition, left and right contact areas 150L and 150R may be formed on both of the two gate lines 130L and 130R, i.e., the right end of the left gate line 130L and the left end of the right gate line 130R, to provide a signal input and output of the two gate lines 130L and 130R.

As such, when the left and right contact areas 150L and 150R are formed on the left and right gate lines 130L and 130R, respectively, the cutting area CT may be arranged between the left contact area 150L and the right contact area 150R while satisfying the design rule. However, a third distance D3 between the cutting area CT and the left contact area 150L and/or a fourth distance D4 between the cutting area CT and the right contact area 150R may be longer than the minimum distance allowed by the design rule. Accordingly, an unnecessary parasitic capacitance may be still generated. As shown in FIG. 2C, the left contact area 150L and the right contact area 150R may be formed with different widths. That is, the left contact area 150L may have a second width W2, and the right contact area 150R may have a third width W3. Of course, the left contact area 150L and the right contact area 150R may be formed with the same width.

Figure 2D:
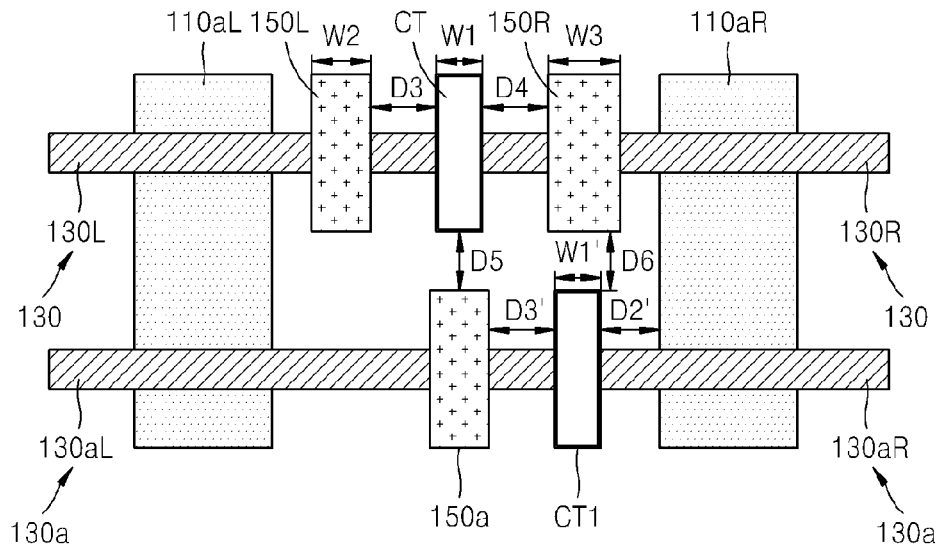

Referring to FIG. 2D, in a semiconductor integrated circuit, two (upper and lower) gate lines 130 and 130a may be formed to cross two (left and right) active areas 110aL and 110aR. The two gate lines 130 and 130a may be cut into an upper left gate line 130L and an upper right gate line 130R, and a lower left gate line 130aL and a lower right gate line 130aR, by two (upper and lower) cutting areas CT and CT1, respectively, according to a function of the semiconductor integrated circuit. In addition, upper left and right contact areas 150L and 150R may be formed on the upper left and right gate lines 130L and 130R, and a lower contact area 150a may be formed on the lower left gate line 130aL.

In the layout of the semiconductor integrated circuit having the above arrangement, distances D3 and D4 between the upper cutting area CT and the upper left and right contact areas 150L and 150R and distances D3' and D2' between the lower cutting area CT1 and the lower contact area 150a and the right active area 110aR may cause the generation of an unnecessary parasitic capacitance. In addition, when a cutting area is arranged on any one gate line, the design rule associated with a device area or cutting area on another gate line should be satisfied. For example, a fifth distance D5 between the upper cutting area CT and the lower contact area 150a and a sixth distance D6 between the upper right contact area 150R and the lower cutting area CT1 should satisfy the design rule.

Figure 2E:
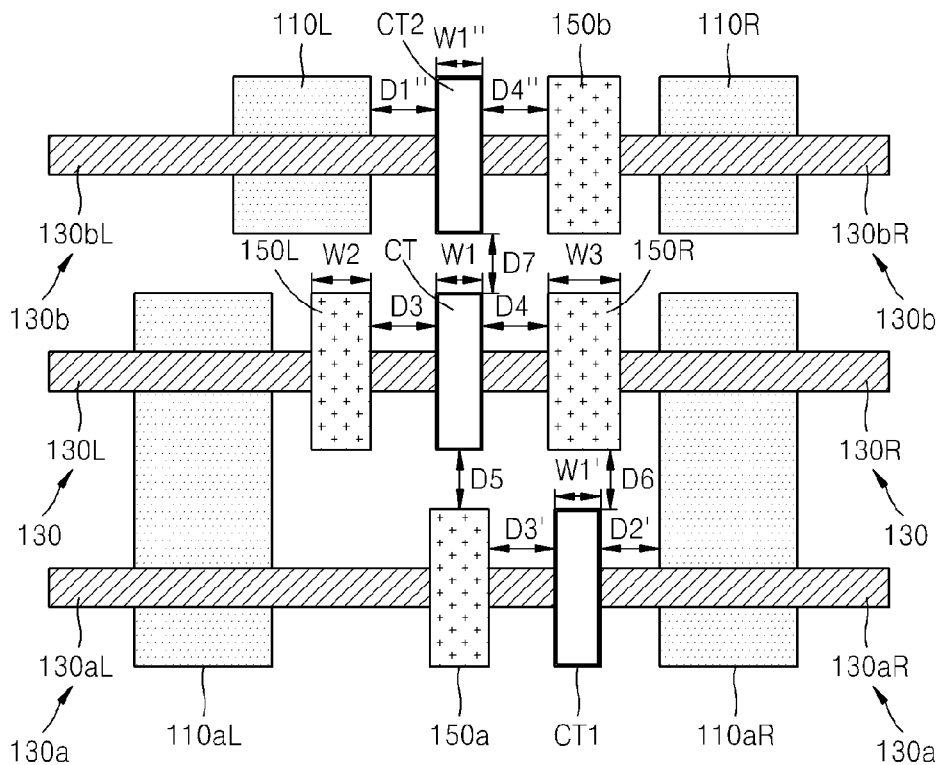

Referring to FIG. 2E, in a semiconductor integrated circuit, two gate lines 130 and 130a may be formed to cross two active areas 110aL and 110aR, and a single gate line 130b may be formed to cross two other active areas 110L and 110R. In addition, the three gate lines 130, 130a, and 130b may be cut by cutting areas CT, CT1, and CT2, respectively, according to a function of the semiconductor integrated circuit. Contact areas 150L and 150R may be formed on central left and right gate lines 130L and 130R, respectively, a contact area 150a may be formed on a lower left gate line 130aL, and a contact area 150b may be formed on an upper right gate line 130bR.

In the layout of the semiconductor integrated circuit having the above arrangement, distances D3, D4, D3', D2', D1", and D4" between the cutting areas CT, CT1, and CT2 and the contact areas or active areas may cause the generation of an unnecessary parasitic capacitance. In addition, when a cutting area is arranged on any one gate line, the design rule associated with a device area or cutting area on another gate line should be satisfied. For example, a fifth distance D5 between the central cutting area CT and the lower contact area 150a, a sixth distance D6 between the central right contact area 150R and the lower cutting area CT1, and a seventh distance D7 between the upper cutting area CT2 and the central cutting area CT should satisfy the design rule.

Various forms of arrangement of a cutting area have been described, and it has been described that an unnecessary parasitic capacitance may be generated even though the arrangement of a cutting area meets the design rule. Accordingly, the semiconductor integrated circuit designing method according to the current exemplary embodiment may provide a method of arranging a cutting area to minimize a parasitic capacitance in the layouts of a semiconductor integrated circuit. That is, the semiconductor integrated circuit designing method according to the current exemplary embodiment may arrange a cutting area to minimize a parasitic capacitance while the design rule is satisfied by automatically arranging the cutting area using an arrangement process. The arrangement process applied to the semiconductor integrated circuit designing method will now be described in more detail.

Figure 3A:
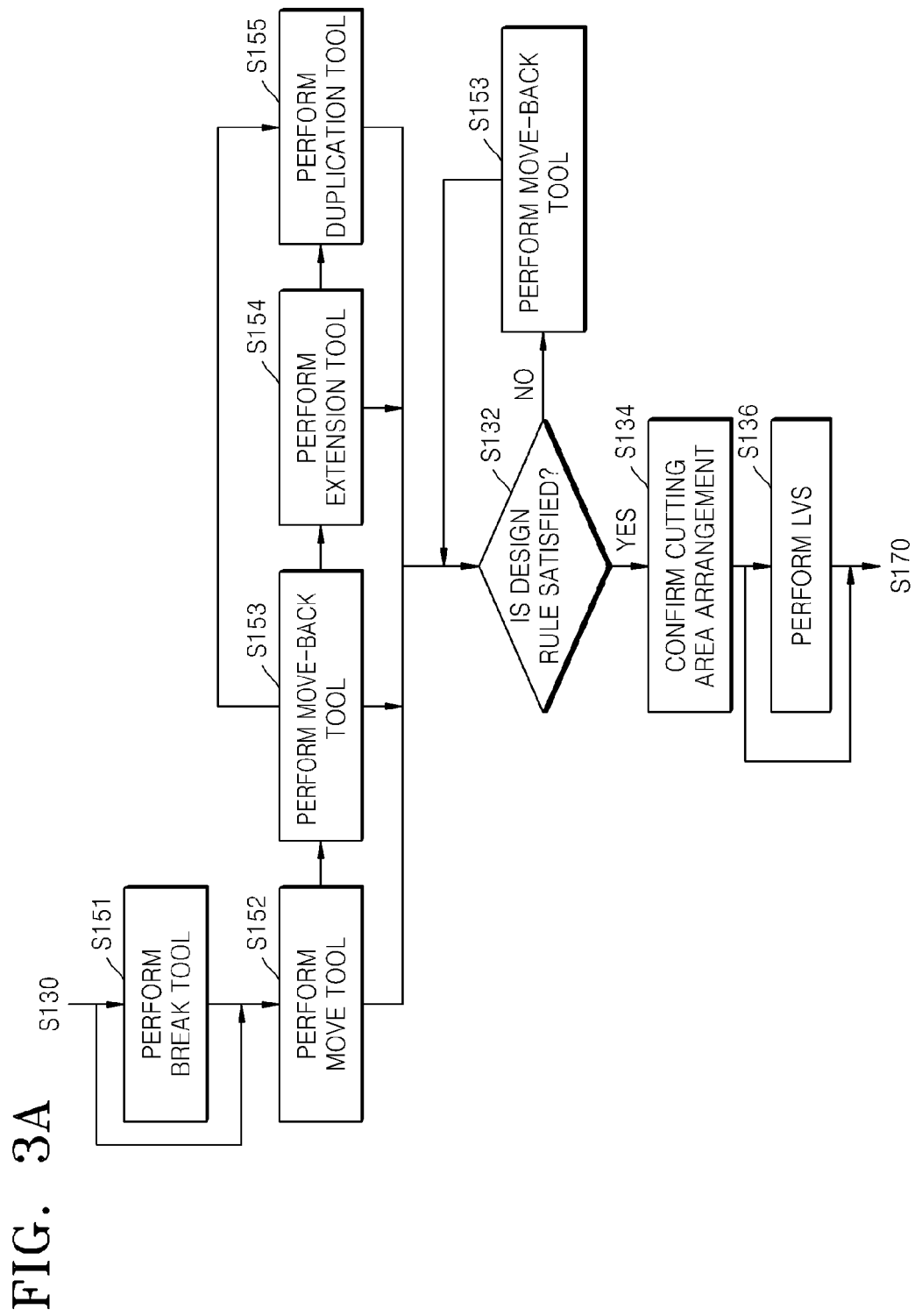
Figure 3C:
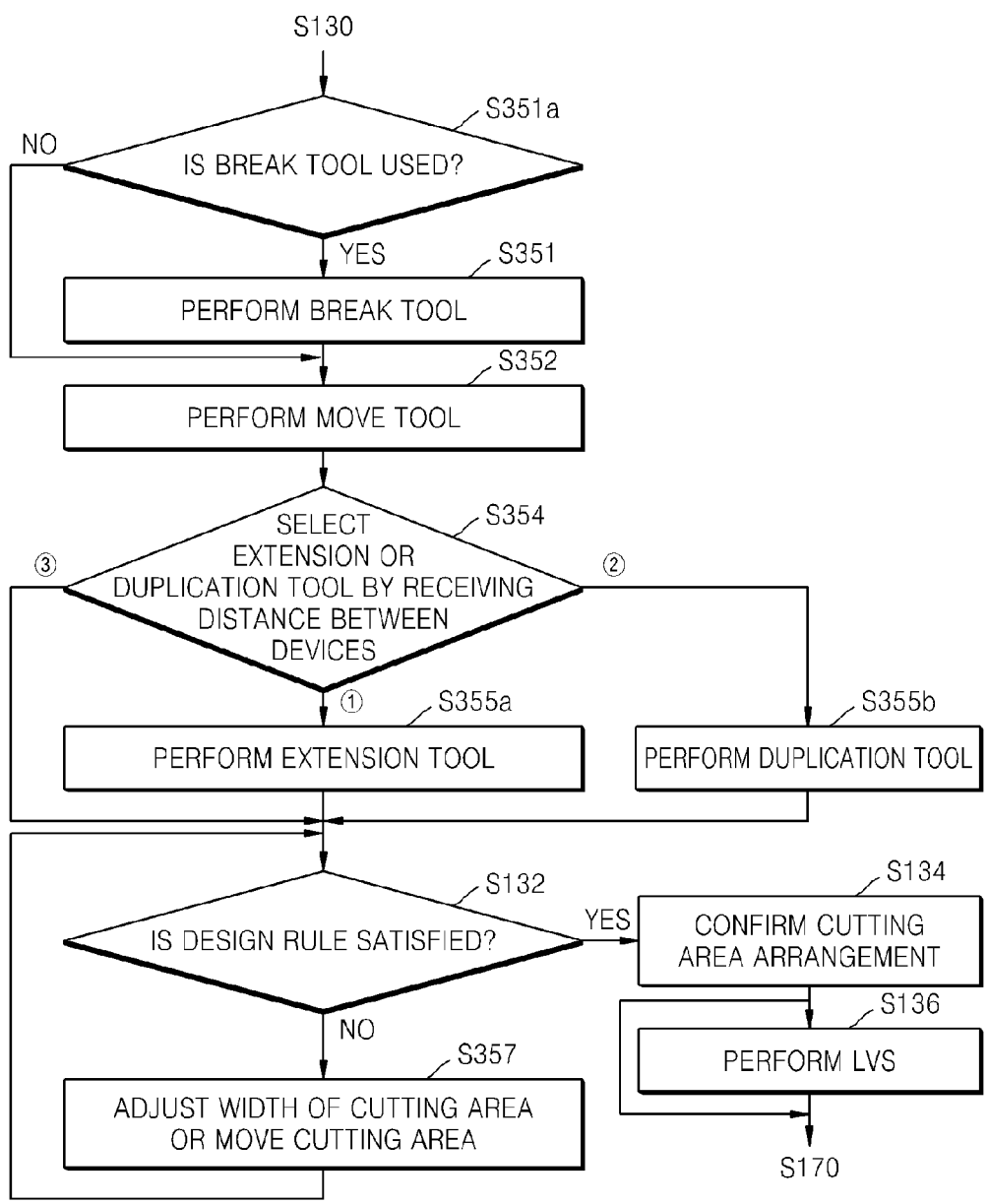

FIGS. 3A to 3C are flowcharts showing in more detail operation S150 (arranging a cutting area using an arrangement process) in the method of FIG. 1, according to exemplary embodiments.

Referring to FIG. 3A, a break tool is performed in operation S151. The break tool may divide a cutting area on a gate line basis when the cutting area is designed to cut several conductive lines, e.g., several gate lines, at the same time. That is, in the case of a single cutting area crossing and cutting multiple gate lines, the break tool may break the cutting area into multiple cutting areas. Alternatively, if the cutting area is set for a single gate line, the performing of the break tool (operation S151) may be omitted.

In operation S152, a move tool is performed. The move tool may move a cutting area in one direction along a gate line. The move tool may arrange the cutting area by moving it along the gate line while a space corresponding to a pre-set distance between the cutting area and an adjacent device area or contact area is maintained. The pre-set distance may be a distance according to the design rule or a larger distance. When an adjacent device is a transistor, a distance between the device area and the cutting area may be a distance between an active area of the transistor and the cutting area.

In operation S153, a move-back tool is performed. The move-back tool may move a cutting area in an opposite direction of a direction previously moved by the move tool, i.e., a reverse direction, when a moved cutting area violates the design rule in a relationship between the moved cutting area and a device area on another gate line. When a cutting area is moved by the move tool, the design rule is not violated in a relationship between the cutting area and a device or contact area on the same gate line based on the concept of the pre-set distance. However, the concept of the pre-set distance is not applied to a device area, e.g., an active area of a transistor, on another gate line, a contact area on another gate line, or a cutting area cutting another gate line. Thus, after a cutting area is moved by the move tool, the cutting area may violate the design rule in a relationship between the cutting area and a device area or cutting area on another gate line. In this case, to satisfy the design rule, the cutting area may be moved in the reverse direction using the move-back tool. The movement by the move-back tool may be performed in the reverse direction on a pre-set unit step basis. That is, it is checked whether the design rule is satisfied in relationships between the cutting area and devices on other gate lines every time the cutting area is moved in the reverse direction by the pre-set unit step, and if the design rule is satisfied, the movement by the move-back tool may be completed. If the design rule is satisfied between the cutting area and the devices on other gate lines after the cutting area is moved by the move tool, the move-back tool may not be performed.

In operation S154, an extension tool is performed. The extension tool may extend a width of a cutting area existing between two adjacent device areas, e.g., between active areas of two transistors, in the other device direction when a distance between the cutting area and any one device area maintains the pre-set distance while a distance between the cutting area and the other device area maintains a distance larger than the pre-set distance. As such, by extending the width of the cutting area using the extension tool, the distance between the cutting area and the other device area may maintain the pre-set distance. Although use of the extension tool is described above in the case of two adjacent device areas, the concept of the extension tool also may be applied between adjacent device and contact areas or between two adjacent contact areas.

However, the extension tool may be applied in consideration of all of a distance between device areas, a width of a cutting area, and a pre-set distance, rather than applied only in consideration of the pre-set distance. When the extension tool is not suitable under consideration of the conditions, a duplication tool to be described below may be applied.

In operation S155, the duplication tool is performed. The duplication tool may duplicate a cutting area and arrange the duplicated cutting area with the pre-set distance from any one device area when the cutting area is asymmetrically arranged between two adjacent device areas, i.e., when the cutting area is farther than the pre-set distance from the any one device area.

As described above, whether the extension tool or the duplication tool is used may be determined by fully considering a distance between two adjacent device areas, a width of a cutting area, a pre-set distance, the design rule associated with device areas on other gate lines, and a location relationship with other device areas formed orthogonally. The rule in the use of the extension tool or the duplication tool will be described in more detail later with reference to FIGS. 5A and 5B.

Although in general, the extension tool and the duplication tool are exclusively used from each other for a single gate line, they may be used together in some cases. Of course, the extension tool is used for a single gate line while the duplication tool is used for another gate line.

Neither the extension tool nor the duplication tool may be used based on a distance between device areas, a width of a cutting area, a pre-set distance, and the design rule associated with device areas on other gate lines.

After performing at least one of the move tool, the move-back tool, the extension tool, and the duplication tool, it is checked whether the arranged cutting area satisfies the design rule in operation S132. If the arranged cutting area satisfies the design rule (S132—yes), the arrangement of the cutting area is confirmed in operation S134. If the arranged cutting area does not satisfy the design rule (S132—no), the move-back tool is performed again in operation S153. As described above, the move-back tool may be performed while the cutting area is moved in the reverse direction on the pre-set unit step basis. It is checked whether the design rule is satisfied in operation S132 every time the cutting area is moved in the reverse direction by the pre-set unit step, and if the design rule is satisfied, the arrangement of the cutting area is confirmed in operation S134.

After confirming the arrangement of the cutting area in operation S134, the LVS may be performed in operation S136, or the post-simulation may be directly performed in operation S170 without performing the LVS in operation S136. The checking whether the design rule is satisfied (operation S132), the confirming of the cutting area arrangement (operation S134), and the performing of the LVS (operation S136) may be included in the performing of the layout design (operation S130).

FIG. 3B is a flowchart showing in more detail operation S150 (arranging a cutting area using an arrangement process) in the method of FIG. 1, according to another exemplary embodiment. For convenience of description, the contents described with reference to FIG. 3A are briefly described or omitted.

Referring to FIG. 3B, it is determined whether the break tool is used in operation S251a. For example, when a cutting area is designed to cut several gate lines at the same time, the break tool may be used, and when the cutting area is designed to cut a single gate line, the break tool may not be used. Thus, if the break tool is used (S251a—yes), the break tool is performed in operation S251. Otherwise, if the break tool is not used (S251a—no), the move tool is performed in operation S252.

In the performing of the break tool (operation S251), the cutting area that crosses several gate lines is divided into unit cutting areas on a gate line basis. In the performing of the move tool (operation S252), the cutting area is moved in one direction along the gate line and is arranged at a position on the gate line to maintain a pre-set distance between the cutting area and an adjacent device or contact area. When operation S252 is performed after operation S251, the move tool may be performed for each unit cutting area.

After the performing of the move tool (operation S252), it is checked in operation S132 whether the design rule is satisfied. This design rule check may be performed between a cutting area arranged on a certain gate line by the move tool and device areas on other gate lines. If the design rule is satisfied (S132—yes), the extension tool or the duplication tool is selected based on a distance between devices in operation S254. Otherwise, if the design rule is not satisfied (S132—no), the move-back tool is performed in operation S253.

The move-back tool may be performed (operation S253) while the cutting area is moved in the reverse direction on a pre-set unit step basis. It is checked whether the design rule is satisfied (operation S132) every time the cutting area is moved in the reverse direction by the pre-set unit step, and if the design rule is satisfied, the performing of the move-back tool (operation S253) may be completed.

In the selecting of the extension tool or the duplication tool (operation S254), it may be determined whether the extension tool or the duplication tool is performed by receiving a distance between two adjacent device areas. That is, whether the extension tool or the duplication tool is performed may be determined based on the received distance information. The contents of the determining of whether the extension tool or the duplication tool is performed will be described in more detail with reference to FIGS. 5A and 5B. In a case where neither of the extension tool and the duplication tool has to be performed (case ③), this process may directly proceed to operation S132 to check whether the design rule is satisfied.

In a case where the extension tool is selected (case ①), the extension tool is performed in operation S255a, and in a case where the duplication tool is selected (case ②), the duplication tool is performed in operation S255b. In the performing of the extension tool (operation S255a), a width of the cutting area is extended for both sides of the cutting area to maintain the pre-set distance from an adjacent device or contact area. In the performing of the duplication tool (operation S255b), the cutting area is duplicated, and the duplicated cutting area is arranged at a location near a device or contact area apart farther from the original cutting area so that the duplicated cutting area maintains the pre-set distance from the device or contact area.

After the performing of the extension tool (operation S255a) or the performing of the duplication tool (operation S255b), it is checked in operation S132 whether the design rule is satisfied. If the design rule is satisfied (S132—yes), the cutting area arrangement is confirmed in operation S134. Otherwise, if the design rule is not satisfied (S132—no), the width of the cutting area is adjusted, or the cutting area is moved in operation S257.

In the adjusting of the width of the cutting area or the moving of the cutting area (operation S257), the width of the cutting area is adjusted or the cutting area is moved to satisfy the design rule. In more detail, if the design rule is violated in a relationship between the cutting area and a device area on another gate line when the width of the cutting area is extended by the extension tool, the width of the cutting area is reduced to satisfy the design rule. In addition, if the design rule is violated in a relationship between the newly duplicated cutting area and a device area on another gate line, the duplicated cutting area is moved to satisfy the design rule.

After the confirming of the cutting area arrangement (operation S134), the LVS may be performed in operation S136, or the post-simulation may be directly performed in operation S170 without performing the LVS in operation S136.

FIG. 3C is a flowchart showing in more detail operation S150 (arranging a cutting area using an arrangement process) in the method of FIG. 1, according to another exemplary embodiment. For convenience of description, the contents described with reference to FIG. 3A or 3B are briefly described or omitted.

Referring to FIG. 3C, it is determined in operation S351a whether the break tool is used. If the break tool is used (S351a—yes), the break tool is performed in operation S351. Otherwise, if the break tool is not used (S351a—no), the move tool is performed in operation S352. In the performing of the break tool (operation S351), the cutting area that crosses several gate lines is divided into unit cutting areas on a gate line basis. In the performing of the move tool (operation S352), the cutting area is moved in one direction along the gate line and is arranged to maintain a space corresponding to a pre-set distance between the cutting area and an adjacent device or contact area. When operation S352 is performed after operation S351, the move tool may be performed for each unit cutting area.

After the performing of the move tool (operation S352), it is selected in operation S354 whether the extension tool or the duplication tool is performed. In a case where the extension tool is selected (case ①), the extension tool is performed in operation S355a, and in a case where the duplication tool is selected (case ②), the duplication tool is performed in operation S355b. In a case where neither of the extension tool and the duplication tool has to be performed (case ③), this process may directly proceed to operation S132 to check whether the design rule is satisfied.

In the performing of the extension tool (operation S355a), a width of the cutting area is extended for both sides of the cutting area to maintain the pre-set distance from an adjacent device or contact area. In the performing of the duplication tool (operation S355b), the cutting area is duplicated, and the duplicated cutting area is arranged at a location near a device or contact area apart farther from the original cutting area so that the duplicated cutting area maintains the pre-set distance from the device or contact area.

After the performing of the extension tool (operation S355a) or the performing of the duplication tool (operation S355b), it is checked in operation S132 whether the design rule is satisfied. If the design rule is satisfied (S132—yes), the cutting area arrangement is confirmed in operation S134. Otherwise, if the design rule is not satisfied (S132—no), the width of the cutting area is adjusted, or the cutting area is moved in operation S357.

In the adjusting of the width of the cutting area or the moving of the cutting area (operation S357), the width of the cutting area is adjusted or the cutting area is moved to satisfy the design rule. In more detail, if the design rule is violated in a relationship between the cutting area and a device area on another gate line when the width of the cutting area is extended by the extension tool, the width of the cutting area is reduced to satisfy the design rule. If the design rule is violated in a relationship between the newly duplicated cutting area and a device area on another gate line, the duplicated cutting area is moved to satisfy the design rule. If the cutting area arranged by the move tool violates the design rule, the cutting area may be moved in the reverse direction in operation S357 to satisfy the design rule. That is, the performing of the move-back tool (operation S253) in FIG. 3B may be included in operation S357.

After the confirming of the cutting area arrangement (operation S134), like in FIG. 3B, the LVS may be performed in operation S136, or the post-simulation may be directly performed in operation S170 without performing the LVS in operation S136.

Although it has been described that a conductive line on which a cutting area is arranged is a gate line, the exemplary embodiments are not limited thereto. For example, the semiconductor integrated circuit designing method according to the exemplary embodiments may be applied to all conductive lines required to be cut. Accordingly, methods of cutting any form or any type of conductive lines by automatically arranging a cutting area using the above-described arrangement process are included in the technical spirit of the inventive concept.

The semiconductor integrated circuit designing method of FIG. 1 and the methods of arranging a cutting area using the arrangement process, which are shown in FIGS. 3A to 3C, may be represented by procedures in a computer-executable semiconductor integrated circuit designing program. As such, by executing the semiconductor integrated circuit designing program in a computer system, the semiconductor integrated circuit designing method may be embodied. Thus, the semiconductor integrated circuit designing method can also be embodied as computer-readable codes stored on a computer-readable recording medium and executed by a computer or processor.

The computer-readable recording medium is any data storage device that can store data which can be thereafter read by a computer system. Examples of the computer-readable recording medium include read-only memory (ROM), random-access memory (RAM), CD-ROMs, magnetic tapes, hard disks, floppy disks, flash memory, and optical data storage devices. The computer-readable recording medium can also be distributed over network coupled computer systems so that the computer-readable code is stored and executed in a distributed fashion.

FIGS. 4A to 4F are top views for showing that a method of arranging a cutting area using the arrangement process is applied to a layout design in the method of FIG. 1.

FIG. 4A shows a layout of the semiconductor integrated circuit initially completed in the performing of the layout design (operation S130 of FIG. 1), in which the arranging of the cutting area using the arrangement process (operation S150 of FIG. 1) has not been performed yet.

Referring to FIG. 4A, each of first to fifth gate lines 130a, 130b, 130c, 130d, and 130e is arranged to cross, for example, active areas of transistors and/or contact areas. In more detail, the first gate line 130a may be arranged to cross a first left active area 110L1, a first right active area 110R1, and a first right contact area 150R1, the second gate line 130b may be arranged to cross a second left active area 110L2, a second left contact area 150L2, and a second right contact area 150R2, the third gate line 130c may be arranged to cross a third left active area 110L3, a third right contact area 150R3, and a third right active area 110R3, and the fifth gate line 130e may be arranged to cross a fourth left active area 110L4, a fourth left contact area 150L4, a fourth right contact area 150R4, and a fourth right active area 110R4. The fourth gate line 130d may cross active areas and/or contact areas in a portion not shown. Of course, the first to third gate lines 130a, 130b, and 130c and the fifth gate line 130e may also cross another active area and/or contact area in a portion not shown.

Figure 6A:
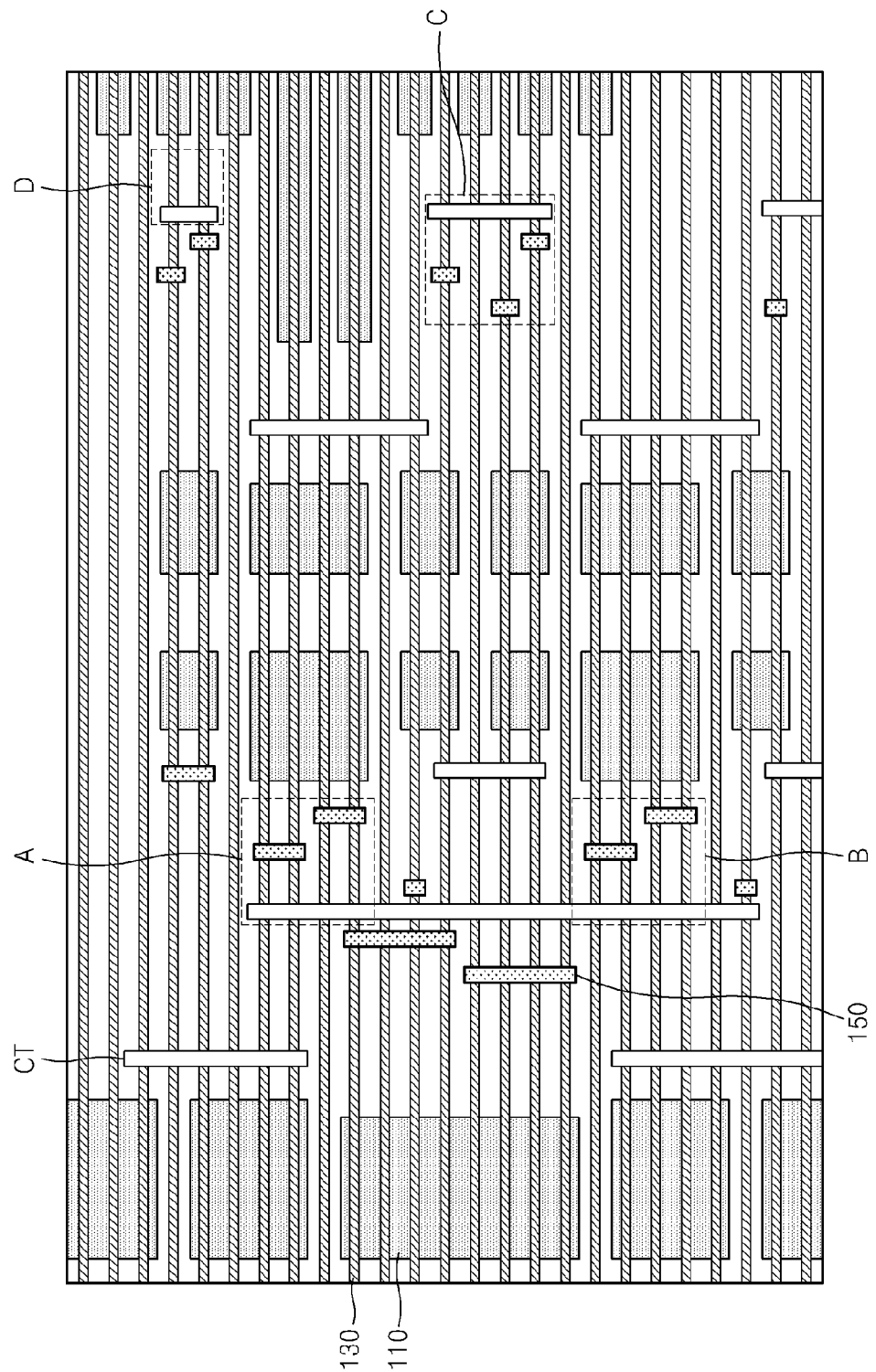

Although the first to third gate lines 130a, 130b, and 130c and the fifth gate line 130e are arranged to cross different active areas in FIG. 4A, the inventive concept is not limited thereto, and a plurality of gate lines may be arranged to cross a single active area as shown in FIG. 6A or 6B.

In the layout in which the device areas are arranged as shown in FIG. 4A, a common cutting area CTsh may be arranged to cut the first to fifth gate lines 130a, 130b, 130c, 130d, and 130e together. The common cutting area CTsh may be arranged to be close to an adjacent active or contact area while the design rule is satisfied. For example, as shown in FIG. 4A, the common cutting area CTsh may be arranged to be close to the second left contact area 150L2 and the second right contact area 150R2.

According to this arrangement, the common cutting area CTsh is arranged to have an asymmetrical distance from each adjacent active or contact area on the first, third, and fifth gate lines 130a, 130c, and 130e, thereby generating an unnecessary parasitic capacitance in an overhead part of a corresponding gate line, which extends longer than the pre-set distance from each active or contact area.

A method of optimizing and arranging the common cutting area CTsh in the layout of FIG. 4A using the tools included in the arrangement process described with reference to FIGS. 3A to 3C will now be described with reference to FIGS. 4B to 4F.

Figure 4B:
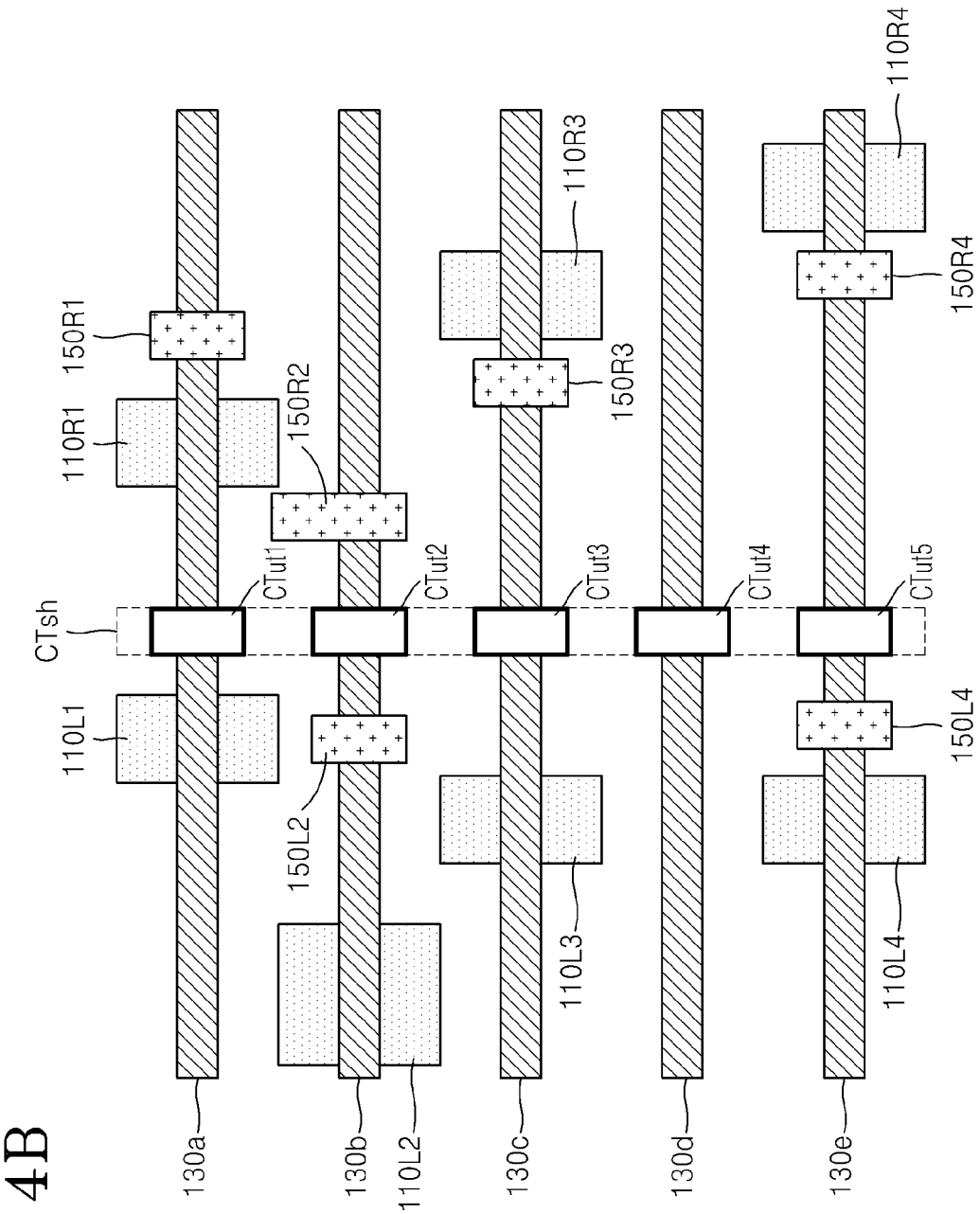

Referring to FIG. 4B, the common cutting area CTsh (dotted line) is divided into first to fifth unit cutting areas CTut1 to CTut5 (bold line) respectively corresponding to the first to fifth gate lines 130a, 130b, 130c, 130d, and 130e using the break tool. By dividing the common cutting area CTsh into the first to fifth unit cutting areas CTut1 to CTut5, the freedom of movement may increase. That is, all active areas and contact areas on the first to fifth gate lines 130a, 130b, 130c, 130d, and 130e have to be considered to move the common cutting area CTsh, while only active areas and contact areas on each corresponding gate line are considered to move the first to fifth unit cutting areas CTut1 to CTut5.

Figure 4C:
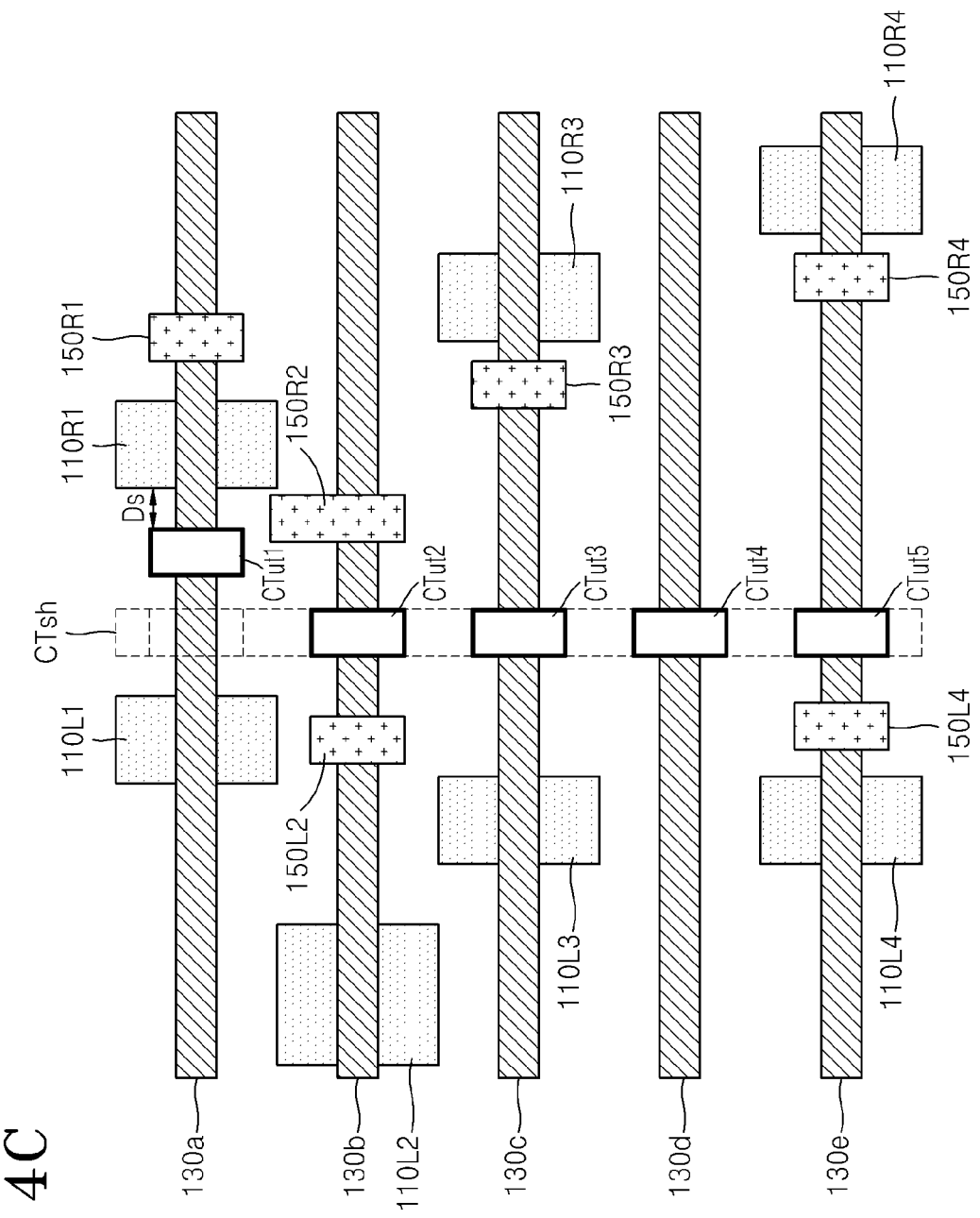

Referring to FIG. 4C, the first unit cutting area CTut1 is moved to the right using the move tool and is arranged to maintain a pre-set distance Ds from the first right active area 110R1. The movement of cutting areas by the move tool may be set in one direction. For example, the movement by the move tool may be set as movement to the right in the current exemplary embodiment. Further, the second to fifth unit cutting areas CTut2 to CTut5 may also be moved to the right by the move tool, and accordingly, each of the second to fifth unit cutting areas CTut2 to CTut5 may be arranged to maintain the pre-set distance Ds from each corresponding active or contact area arranged in the right. However, for convenience of description, it is shown in FIG. 4C that only the first unit cutting area CTut1 is moved to the right.

Figure 4D:
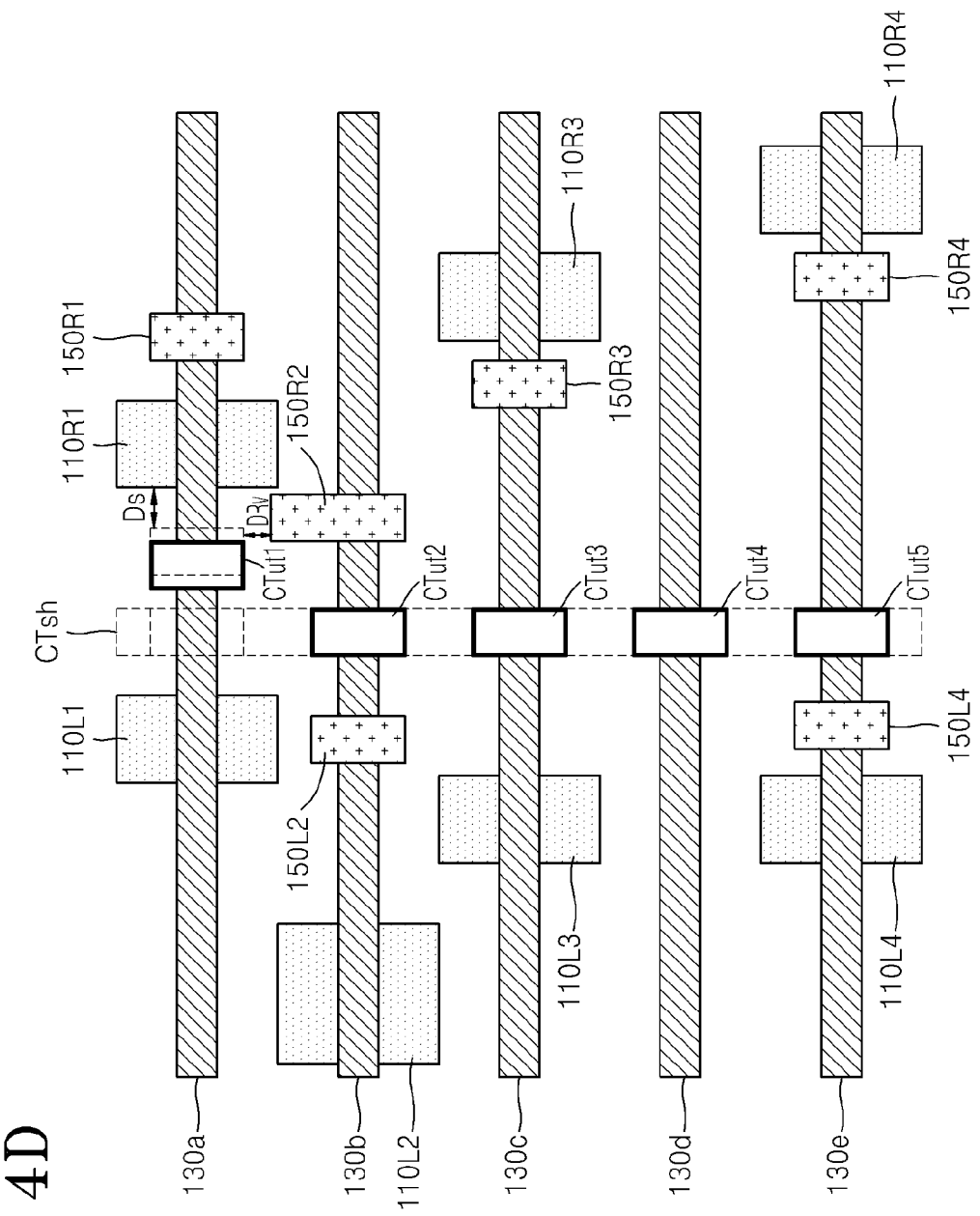

Referring to FIG. 4D, when a cutting area is arranged by using the move tool based on the concept of the pre-set distance Ds as shown in FIG. 4C, the design rule may be violated in a relationship between the first unit cutting area CTut1 and devices on other gate lines, e.g., the right second contact area 150R2 on the second gate line 130b. That is, a distance DRv between the moved first unit cutting area CTut1 and the second right contact area 150R2 may be less than the minimum measure according to the design rule. Thus, the first unit cutting area CTut1 is moved in an opposite direction of the initially moved direction, i.e., a reverse direction, using the move-back tool. The reverse movement by the move-back tool may be performed in a manner in which it is checked whether the design rule is satisfied every time the first unit cutting area CTut1 is moved in the reverse direction by the pre-set unit step, and if the design rule is finally satisfied, the movement in the reverse direction is completed.

Figure 4E:
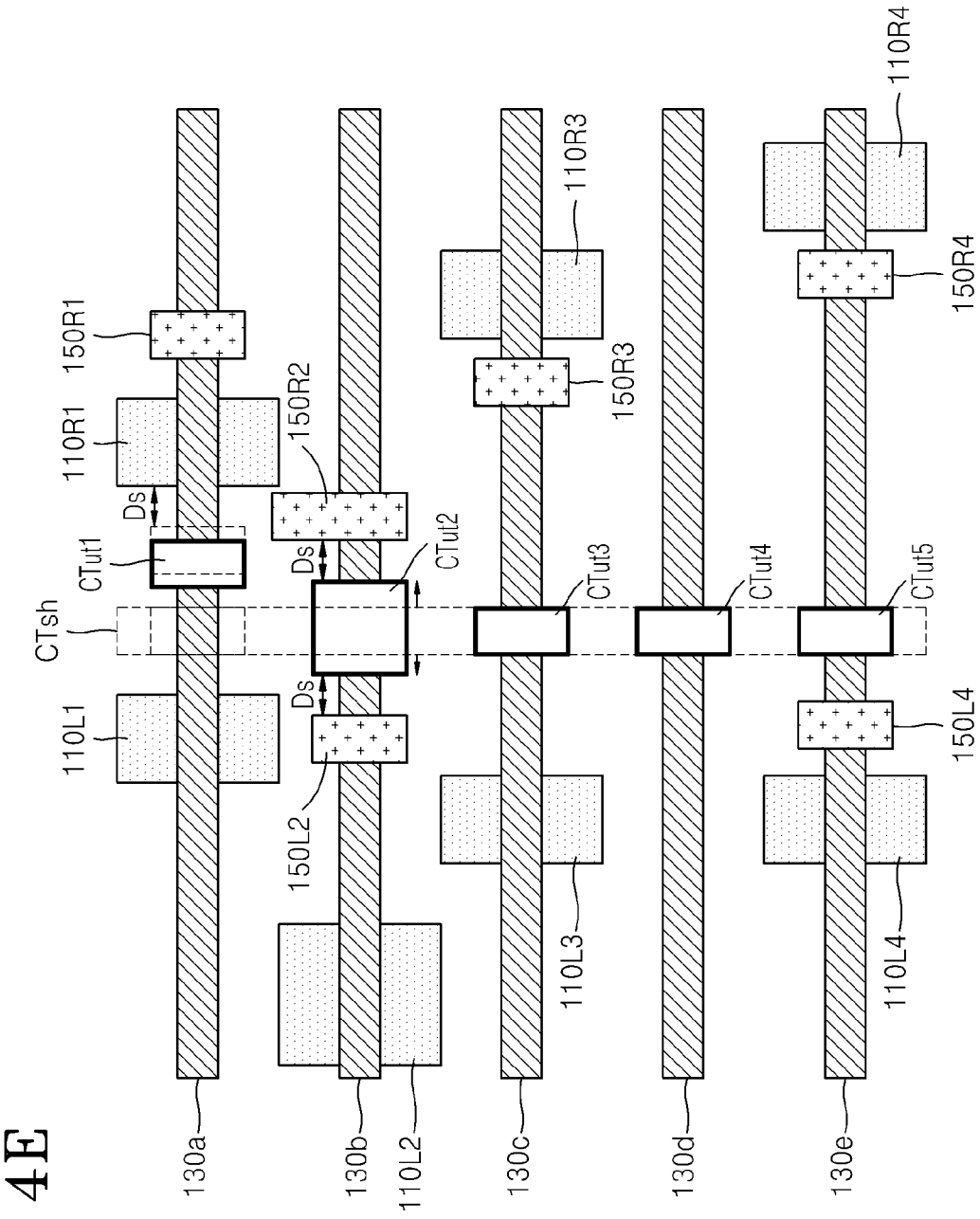

Referring to FIG. 4E, a width of the second unit cutting area CTut2 on the second gate line 130b is extended using the extension tool. Accordingly, both sides of the extended second unit cutting area CTut2 may maintain the pre-set distance Ds from the second left contact area 150L2 and the second right contact area 150R2. The extension of a width of a cutting area using the extension tool may be described in more detail as below.

The second unit cutting area CTut2 is moved to the right by the move tool and is arranged so that the right side of the second unit cutting area CTut2 maintains the pre-set distance Ds from the second right contact area 150R2. In addition, it may be checked whether the design rule is violated, and if the design rule is violated, the reverse movement by the move-back tool may be performed. Thereafter, a distance from the left side of the second unit cutting area CTut2 to the second left contact area 150L2 is received, and if the received distance satisfies a predetermined condition, the width of the second unit cutting area CTut2 is extended to the left so that the left side of the second unit cutting area CTut2 maintains the pre-set distance Ds from the second left contact area 150L2.

Further, it may be checked again after the width extension of the second unit cutting area CTut2 whether the design rule is violated, and if the design rule is violated, the extended width of the second unit cutting area CTut2 may be reduced. That is, after the width extension, if the design rule is violated in a relationship between the left side of the second unit cutting area CTut2 and a device area on another gate line, the left side of the second unit cutting area CTut2 may be moved to the right to reduce the extended width.

Figure 4F:
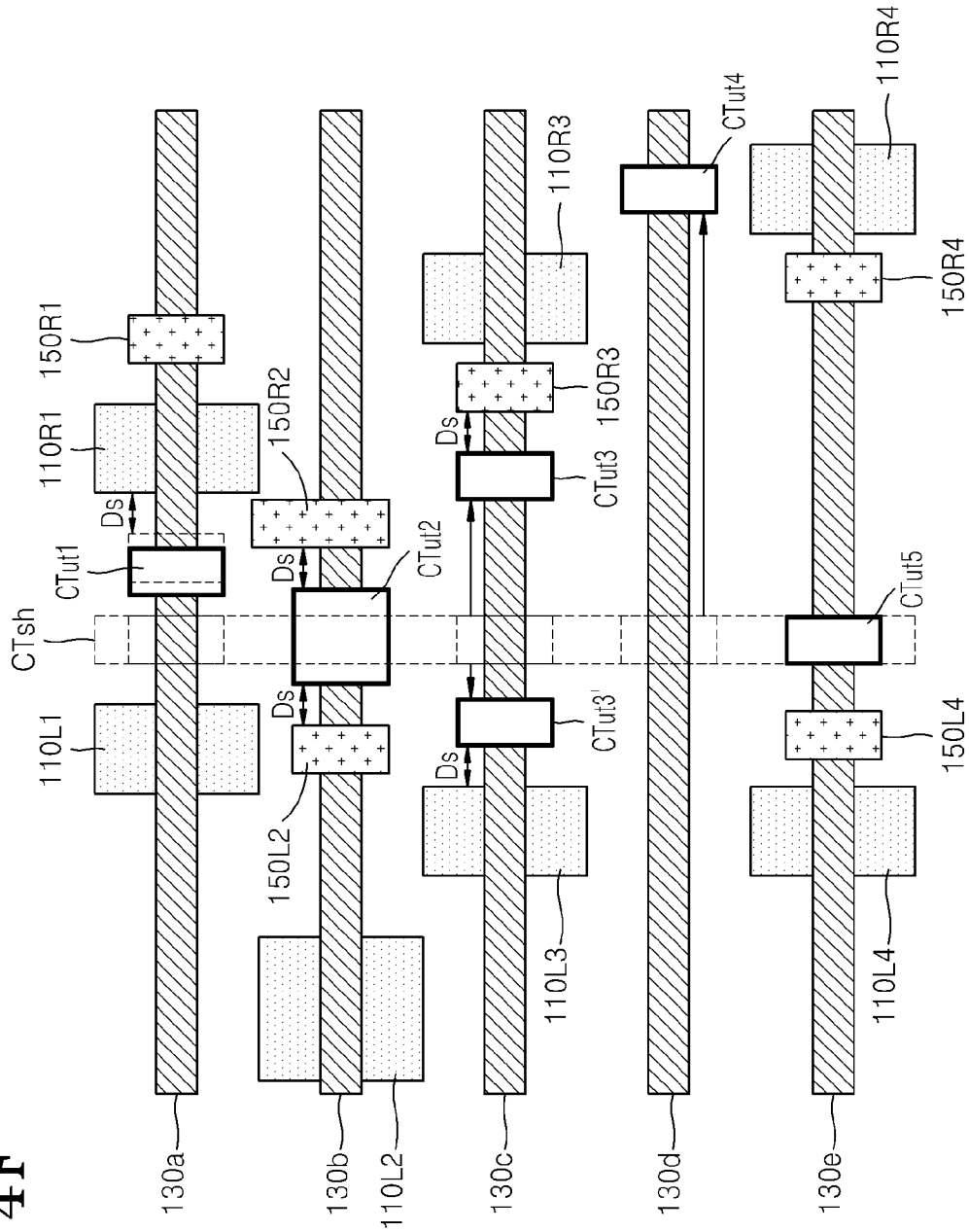

Referring to FIG. 4F, a third unit cutting area CTut3' duplicated using the duplication tool is arranged in the left of the original common cutting area CTsh, and the original third unit cutting area CTut3 is arranged in the right thereof. In more detail, the third unit cutting area CTut3 is moved to the right by the move tool and is arranged so that the right side of the third unit cutting area CTut3 maintains the pre-set distance Ds from the third right contact area 150R3. In addition, it may be checked whether the design rule is violated, and if the design rule is violated, the reverse movement by the move-back tool may be performed.

Thereafter, a distance from the left side of the third unit cutting area CTut3 to the third left active area 110L3 is received, and if the received distance satisfies a predetermined condition, the third unit cutting area CTut3 is duplicated, and the duplicated third unit cutting area CTut3' is arranged to maintain the pre-set distance Ds from the third left active area 110L3. In addition, it may be checked whether the duplicated third unit cutting area CTut3' violates the design rule, and if the design rule is violated, the reverse movement by the move-back tool may be performed. However, in this case, the reverse direction may be the right direction. That is, it may be checked whether the design rule is satisfied every time the duplicated third unit cutting area CTut3' is moved to the right by the pre-set unit step, and if the design rule is finally satisfied, the movement in the reverse direction may be completed to confirm an arrangement location.

In addition, FIG. 4F shows that the fourth unit cutting area CTut4 on the fourth gate line 130d is moved to the right. This shows that device areas are arranged on the fourth gate line 130d although they are not shown, and the fourth unit cutting area CTut4 may be moved by taking these devices into account. In addition, although the fifth unit cutting area CTut5 on the fifth gate line 130e is not changed yet, it may be predicted based on the above-described concepts that arrangement by the duplication tool is performed.

Figure 5A:
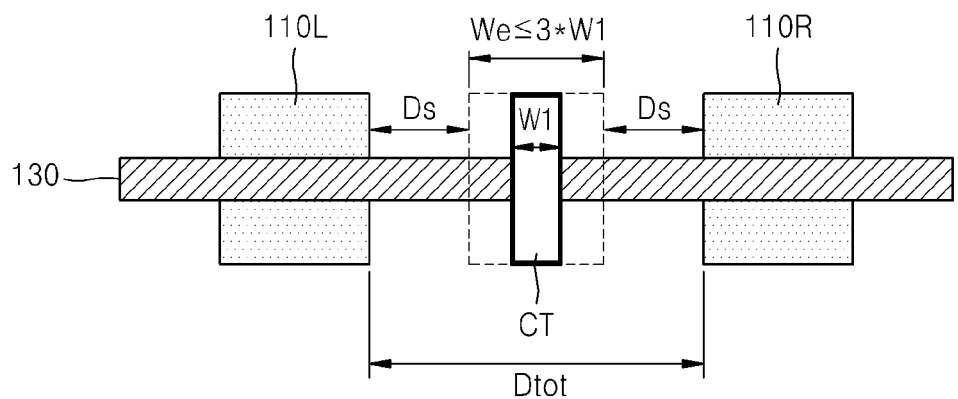
FIGS. 5A and 5B are top views for showing a principle of selectively applying a extension tool and a duplication tool included in the arrangement process in the method of FIG. 1.
Figure 5B:
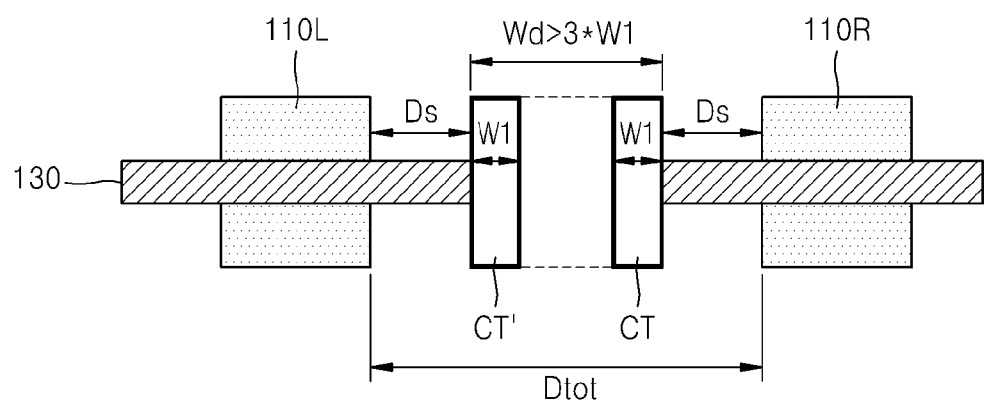

FIGS. 5A and 5B are top views for showing a principle of selectively applying the extension tool and the duplication tool included in the arrangement process in the method of FIG. 1.

Referring to FIGS. 5A and 5B, when a total distance Dtot between active areas 110L and 110R of two adjacent devices, e.g., transistors, is greater than a value obtained by adding two times the pre-set distance Ds to a width W1 of a cutting area CT and is equal to or less than a value obtained by adding two times the pre-set distance Ds to three times the width W1 of the cutting area CT, the extension tool may be applied to the cutting area CT to extend the width W1 of the cutting area CT.

The above condition may be represented by Equation 1.

$$Ds*2+W1<Dtot\leq Ds*2+W1*3 \quad (1)$$

In other words, the extended width We of the cutting area CT may be equal to or less than three times the width W1 of the cutting area CT.

When the total distance Dtot between the active areas 110L and 110R of the two adjacent devices, e.g., transistors, is equal to or greater than the value obtained by adding two times the pre-set distance Ds to three times the width W1 of the cutting area CT, the duplication tool may be applied to the cutting area CT to duplicate the cutting area CT and arrange two cutting areas CT and CT'.

The above condition may be represented by Equation 2.

$$Dtot \geq Ds*2+W1*3 \quad (2)$$

In other words, a width Wd of the two cutting areas CT and CT' may be greater than three times the width W1 of the cutting area CT.

When the total distance Dtot is equal to the value obtained by adding two times the pre-set distance Ds to three times the width W1 of the cutting area CT, it may not matter whether the extension tool or the duplication tool is applied. The criterion of Equations 1 and 2 is based on that it may be difficult to form the two cutting areas CT and CT' because a distance between the two cutting areas CT and CT' is less than the width W1 of the cutting area CT when the two cutting areas CT and CT' are arranged in a case where the total distance Dtot is less than the value obtained by adding two times the pre-set distance Ds to three times the width W1 of the cutting area CT. When the width W1 of the cutting area CT is set very wide from the first time, the above criterions may be changed.

In addition, other conditions to select the extension tool or the duplication tool may be defined according to a designer's taste. For example, five times the width W1 of the cutting area CT may be used as a criterion.

FIGS. 6A and 6B are top views for showing that the method of FIG. 1 is applied to an actual layout of a semiconductor integrated circuit.

Referring to FIG. 6A, a plurality of gate lines 130 are arranged to cross a plurality of active areas 110 and contact areas 150. In addition, unlike FIGS. 4A to 4F, a plurality of gate lines 130 are arranged to cross any one single active area 110. In a case of the contact areas 150, contact areas 150 which a single gate line 130 crosses are arranged in the right, while contact areas 150 which several gate lines 130 cross are arranged in the left.

Cutting areas CT having the structure of the common cutting area CTsh shown in FIG. 4A are arranged to cut a plurality of gate lines 130. Dotted boxes A to D indicate parts in which an unnecessary parasitic capacitance may be generated when cutting areas CT are arranged as shown in FIG. 6A, wherein the parasitic capacitance may be minimized by rearranging the cutting areas CT in the method of FIG. 1.

Referring to FIG. 6B, in the dotted boxes A to D, each cutting area CT is divided into unit cutting areas, and each corresponding unit cutting area is extended to its adjacent contact area 150 using the extension tool, thereby reducing the generation of a parasitic capacitance. Although only the break tool and the extension tool are used in FIG. 6B for convenience of description, each cutting area CT may be optimally arranged by applying the above-described various tools, e.g., the move tool, the move-back tool, and the duplication tool, in a combination way, thereby minimizing an overhead in a corresponding gate line and thus minimizing the generation of a parasitic capacitance.

FIG. 7 is a flowchart illustrating a method of fabricating a semiconductor integrated circuit according to an exemplary embodiment.

Referring to FIG. 7, in operation S100, a layout of a semiconductor integrated circuit to be fabricated is designed. The layout design of a semiconductor integrated circuit may be identical to the semiconductor integrated circuit designing method of FIG. 1. Thus, a description thereof is omitted.

If the layout of the semiconductor integrated circuit is completely designed, the semiconductor integrated circuit is fabricated based on the completed layout in operation S300.

The fabricating of the semiconductor integrated circuit (operation S300) may include: preparing data of the layout (operation S310); performing the OPC (operation S330); producing a mask (operation S350); and forming the semiconductor integrated circuit (operation S370). The preparing of the data of the layout (operation S310) may indicate that whole data of the completed layout is collected to prepare the performing of the OPC.

When a mask is produced using the layout as it is and a photolithography process is performed using the mask, another form of pattern is produced due to an optical proximity effect. Thus, the same pattern as the original layout may be formed on a wafer by modifying the layout on which an error due to the optical proximity effect is reflected and producing a mask based on the modified layout. The performing of the OPC (operation S330) may indicate a process of modifying the layout by reflecting the error due to the optical proximity effect.

In the producing of the mask (operation S350), the mask may be produced using the OPC-reflected layout, e.g., using a Graphic Design System (GDS) on which the OPC is reflected, and in the forming of the semiconductor integrated circuit (operation S370), the semiconductor integrated circuit may be formed on a wafer through the photolithography process using the produced mask.

Figure 8A:
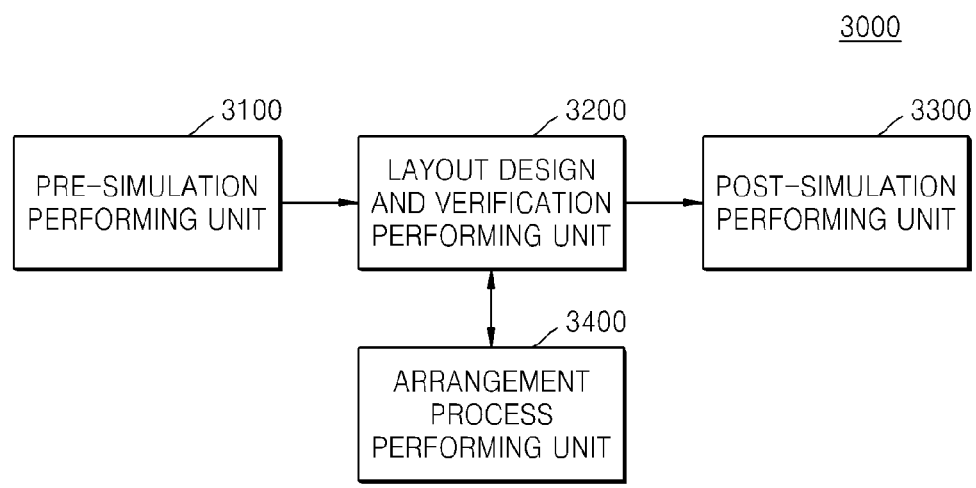
FIG. 8A is a block diagram of an apparatus for designing a semiconductor integrated circuit according to an exemplary embodiment.

FIG. 8A is a block diagram of an apparatus 3000 for designing a semiconductor integrated circuit according to an exemplary embodiment.

Referring to FIG. 8A, the apparatus 3000 may include a pre-simulation performing unit 3100, a layout design and verification performing unit 3200, a post-simulation performing unit 3300, and an arrangement process performing unit 3400.

The pre-simulation performing unit 3100 may perform the HLD, the RTL coding, the synthesis, the GLS, etc. The layout design and verification performing unit 3200 performs a layout design. As described above, the layout design indicates a process of arranging cells based on the design rule and connecting wirings therebetween. The layout design and verification performing unit 3200 may perform the DRC and the LVS. The post-simulation performing unit 3300 may check the functional completeness of the layout by extracting and simulating a parasitic component, such as a parasitic capacitance, of the layout.

The arrangement process performing unit 3400 performs cutting area arrangement using the arrangement process together with the layout design and verification performing unit 3200. The apparatus 3000 may automatically optimize and arrange a cutting area using the arrangement process in a layout design, thereby minimizing an overhead in a gate line and thus minimizing the generation of a parasitic capacitance.

Figure 8B:
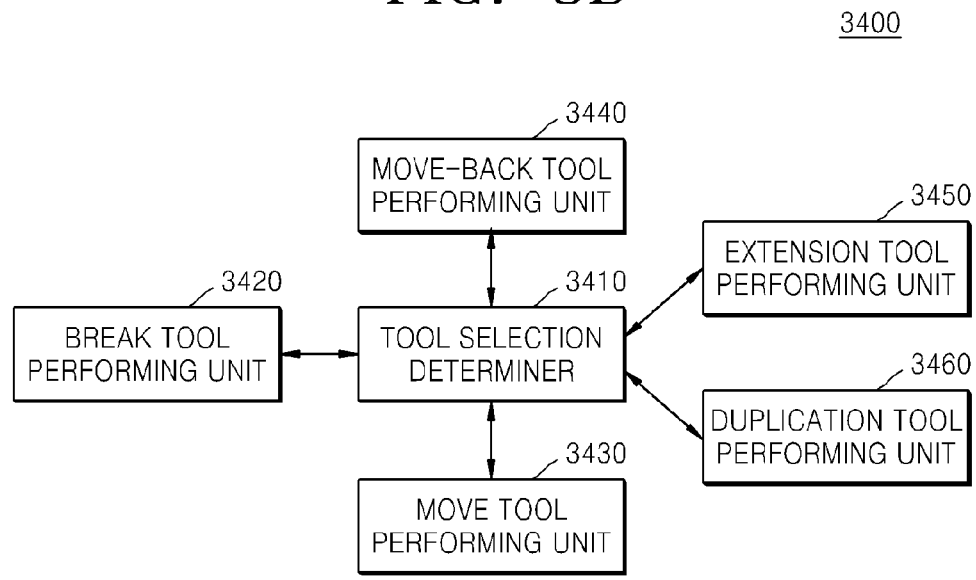
FIG. 8B is a block diagram of an arrangement process performing unit in the apparatus of FIG. 8A.

FIG. 8B is a block diagram of the arrangement process performing unit 3400 in the apparatus 3000 of FIG. 8A.

Referring to FIG. 8B, the arrangement process performing unit 3400 may include a tool selection determiner 3410, a break tool performing unit 3420, a move tool performing unit 3430, a move-back tool performing unit 3440, an extension tool performing unit 3450, and a duplication tool performing unit 3460.

The tool selection determiner 3410 determines which one of the break tool, the move-back tool, the extension tool, and the duplication tool is performed by checking a predetermined condition. For example, the tool selection determiner 3410 may determine whether a cutting area is designed as a common cutting area cutting several gate lines together, and if the cutting area is designed as a common cutting area, the tool selection determiner 3410 may select the break tool. In addition, the tool selection determiner 3410 may receive a distance between two adjacent device areas and select the extension tool or the duplication tool based on the predetermined condition, e.g., whether Equation 1 or 2 is satisfied.

The break tool performing unit 3420 may divide a common cutting area arranged to cut several gate lines together into unit cutting areas on a gate line basis. The move tool performing unit 3430 may move a cutting area in one direction to maintain a pre-set distance from an adjacent device area. The move-back tool performing unit 3440 may move a cutting area in a reverse direction by a pre-set unit step based on checking of the design rule so that the cutting area satisfies the design rule. The extension tool performing unit 3450 may extend a width of a cutting area when a predetermined condition is satisfied, e.g., when Equation 1 is satisfied. The duplication tool performing unit 3460 may duplicate a cutting area and arrange the two cutting areas on a gate line when a predetermined condition is satisfied, e.g., when Equation 2 is satisfied.

Figure 9A:
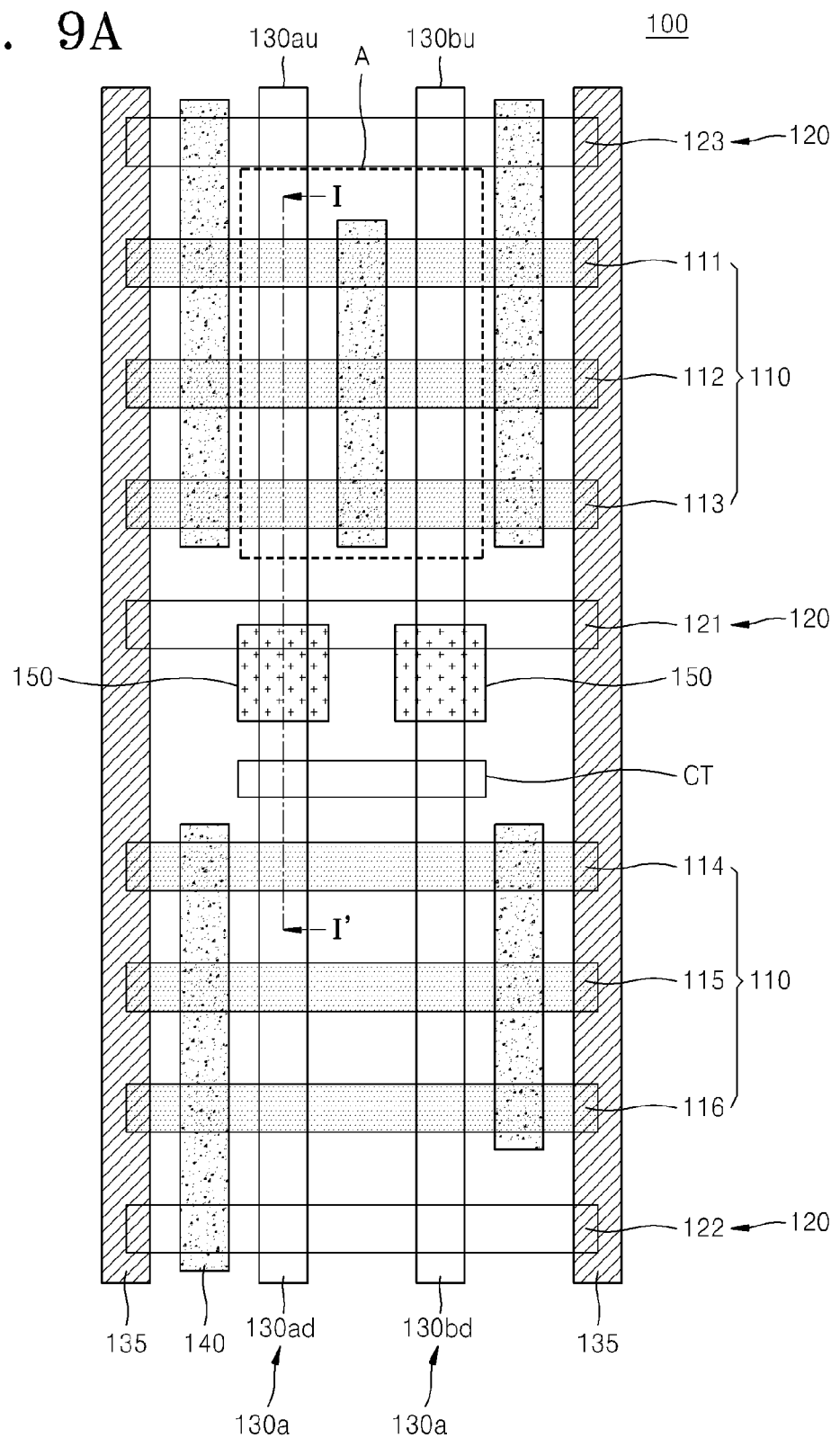
FIG. 9A is a layout of a semiconductor integrated circuit according to an exemplary embodiment.

FIG. 9A is a layout of a semiconductor integrated circuit 100 according to an exemplary embodiment. In detail, FIG.

9A shows an example of a standard cell included in the semiconductor integrated circuit 100.

Referring to FIG. 9A, the semiconductor integrated circuit 100 may include a plurality of active fins 110, a plurality of dummy fins 120, first and second gate lines 130a and 130b, a plurality of dummy gate lines 135, a plurality of source/drain contacts 140, and two input contact areas 150. In addition, a cutting area CT for electrically cutting the first and second gate lines 130a and 130b may be arranged between the two input contact areas 150 and an active fin 114.

The plurality of active fins 110 may include first to sixth active fins 111 to 116, and the plurality of dummy fins 120 may include first to third dummy fins 121 to 123. In the current exemplary embodiment, the semiconductor integrated circuit 100 may be, for example, a NAND gate cell.

A plurality of fins including the plurality of active fins 110 and the plurality of dummy fins 120 may be formed in advance on a semiconductor substrate through a single process. Thereafter, a plurality of gate lines, which include the first and second gate lines 130a and 130b and the plurality of dummy gate lines 135, and the plurality of source/drain contacts 140 may be formed. Thereafter, the two input contact areas 150 and an output terminal may be formed. The first and second gate lines 130a and 130b may be electrically divided into upper first and second gate lines 130au and 130bu and lower first and second gate lines 130ad and 130bd by the cutting area CT. In detail, the first gate line 130a may be divided into the upper first gate line 130au and the lower first gate line 130ad, the second gate line 130b may be divided into the upper second gate line 130bu and the lower second gate line 130bd. The division of the first and second gate lines 130a and 130b may be achieved by etching the first and second gate lines 130a and 130b using a mask pattern having an open area corresponding to the cutting area CT.

The plurality of active fins 110 arranged to be adjacent to each other may form a single fin Field Effect Transistor (FinFET). In the current exemplary embodiment, the first to third active fins 111 to 113 may form a P-channel Metal Oxide Semiconductor (PMOS) transistor, and the fourth to sixth active fins 114 to 116 may form an N-channel MOS (NMOS) transistor. In detail, since the two gate lines 130au and 130bu and the three source/drain contacts 140 are arranged on the first to third active fins 111 to 113, the first to third active fins 111 to 113 may form two PMOS transistors connected in parallel to each other. In addition, since the two gate lines 130ad and 130bd and the two source/drain contacts 140 are arranged on the fourth to sixth active fins 114 to 116, the fourth to sixth active fins 114 to 116 may form two NMOS transistors connected in serial to each other. However, the semiconductor integrated circuit 100 is not limited to the FinFET structure shown in FIG. 9A.

Since a FinFET can use the entire front surface of a protruded fin as a channel, a channel length may be sufficiently secured. Thus, a short channel effect may be prevented or minimized, thereby improving the generation of a leakage current and a size problem due to the short channel effect in conventional MOS transistors.

The semiconductor integrated circuit 100 may be designed using the semiconductor integrated circuit designing method described above. Accordingly, a cutting area may be automatically optimized and arranged using the arrangement process, thereby minimizing an overhead in a gate line and thus minimizing the generation of a parasitic capacitance. In the current exemplary embodiment, the cutting area CT may have a common cutting area structure in which both the first and second gate lines 130a and 130b are cut. This shows that the application of the break tool is omitted because the cutting area CT does not have to be divided when a location relationship with the two input contact areas 150 and the fourth active fin 114 on the first and second gate lines 130a and 130b are considered.

Figure 9B:
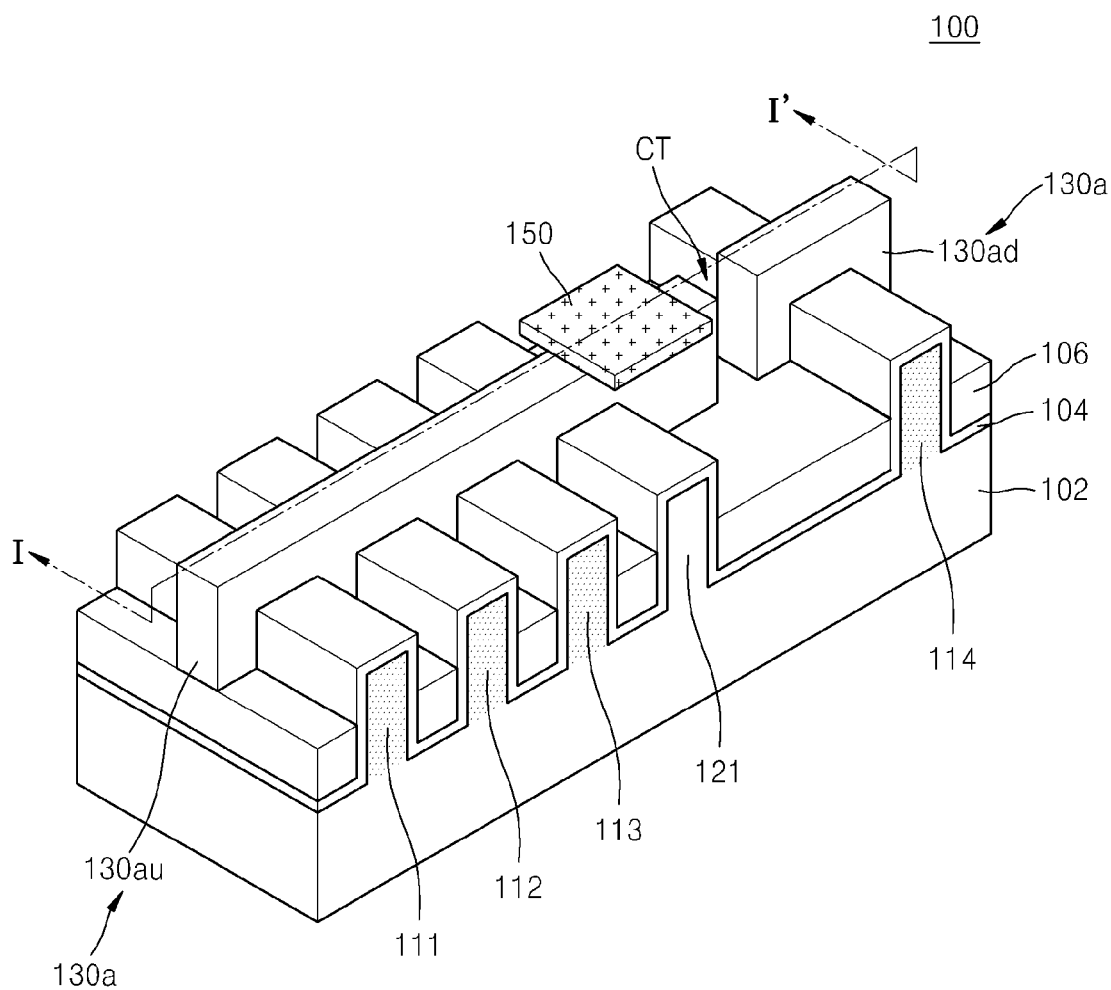
FIG. 9B is a partial perspective view of the semiconductor integrated circuit having the layout of FIG. 9A.
Figure 9C:
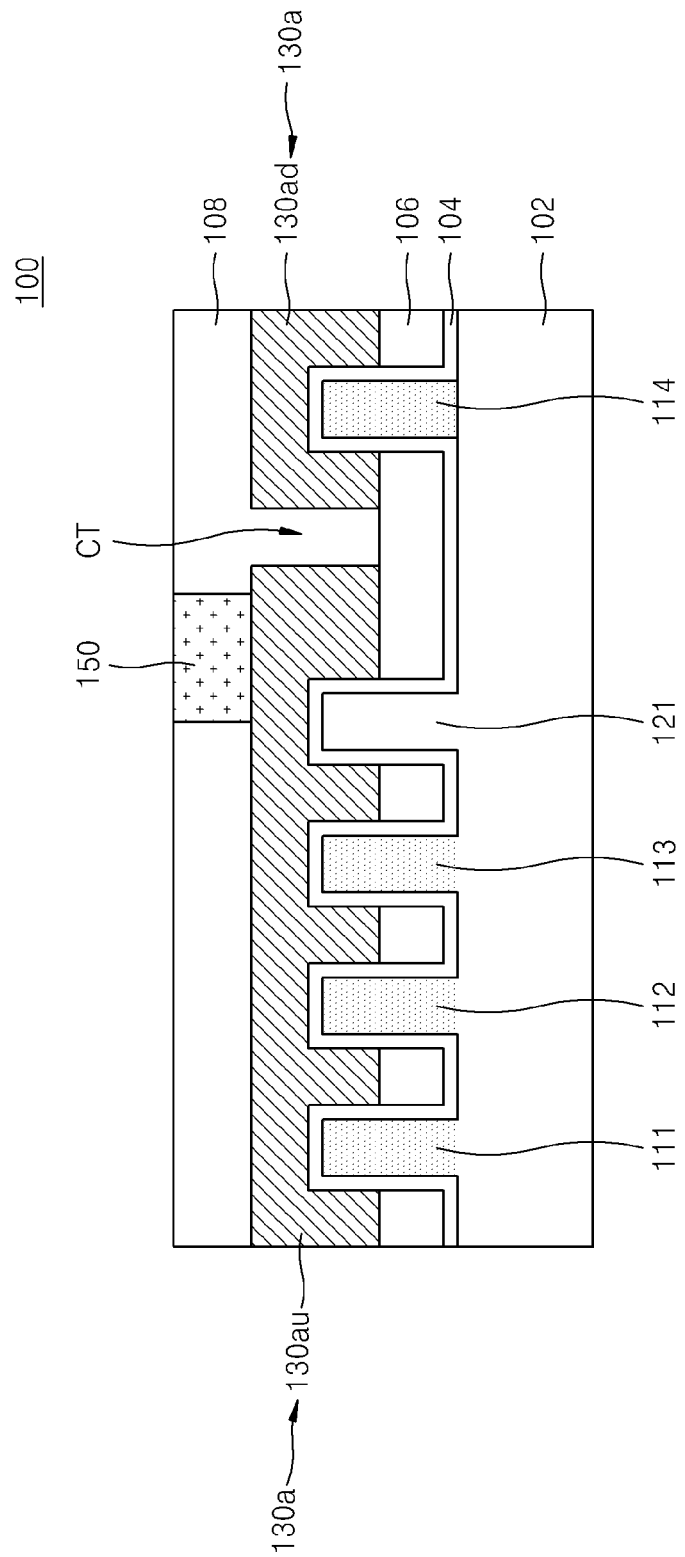
FIG. 9C is a cross-sectional view through line I-I' of the layout of FIG. 9A or I-I' of the semiconductor integrated circuit of FIG. 9B.

FIG. 9B is a partial perspective view of the semiconductor integrated circuit 100 having the layout of FIG. 9A, and FIG. 9C is a cross-sectional view through line I-I' of the layout of FIG. 9A or I-I' of the semiconductor integrated circuit 100 of FIG. 9B.

Referring to FIGS. 9B and 9C, the semiconductor integrated circuit 100 may be a bulk-type FinFET. The semiconductor integrated circuit 100 may include a substrate 102, a first insulation layer 104, a second insulation layer 106, the first to third active fins 111 to 113, the dummy fin 121, the first gate line 130a, and an upper insulation layer 108.

The substrate 102 may be a semiconductor substrate, which may include any one of, for example, Silicon, Silicon-On-Insulator (SOI), Silicon-On-Sapphire (SOS), Germanium, Silicon-Germanium, and Gallium-Arsenide.

The first to third active fins 111 to 113 and the dummy fin 121 may be arranged to be connected to the substrate 102. According to an exemplary embodiment, each of the first to third active fins 111 to 113 may be an active area in which a part protruded vertically from the substrate 102 is doped by n+ or p+, and the dummy fin 121 may be an area in which a part protruded vertically from the substrate 102 is not doped. Although one dummy fin 121 is shown, a plurality of dummy fins 121 may be formed. According to another exemplary embodiment, all of the first to third active fins 111 to 113 and the dummy fin 121 may be active areas doped by n+ or p+.

The first and second insulation layers 104 and 106 and the upper insulation layer 108 may include an insulation substance, which may include any one of, for example, an oxide film, a nitride film, and an oxynitride film. The first insulation layer 104 may be arranged on the first to third active fins 111 to 113 and the dummy fin 121. The first insulation layer 104 may be used as a gate insulation film by being arranged between the first to third active fins 111 to 113 and the first gate line 130a. The second insulation layer 106 may be arranged to have a predetermined height in a space between the first to third active fins 111 to 113 and the dummy fin 121. The second insulation layer 106 may be used as a device separation film by being arranged between the first to third active fins 111 to 113 and the dummy fin 121. The upper insulation layer 108 may be arranged above the first and second insulation layers 104 and 106 and on the first gate line 130a and may function to electrically separate the first gate line 130a from other conductive substances. For convenience of understanding, the upper insulation layer 108 is omitted in FIG. 9B.

The first gate line 130a may be arranged on the first and second insulation layers 104 and 106. Accordingly, the first gate line 130a may have a structure embracing the first to third active fins 111 to 113 and the dummy fin 121. In other words, the first to third active fins 111 to 113 and the dummy fin 121 may be arranged inside the first gate line 130a. As shown in FIGS. 9B and 9C, the first gate line 130a may be electrically divided into the upper first gate line 130au and the lower first gate line 130ad by the cutting area CT. The division of the first gate line 130a may be achieved by optimally arranging the cutting area CT, thereby minimizing an overhead in the first gate line 130a and thus minimizing the generation of a parasitic capacitance. The first gate line 130a may include metal substances, such as W and Ta, nitrides thereof, silicides thereof, a doped polysilicon, etc. and may be formed using an evaporation process.

The input contact area 150 contacting with the first gate line 130*a* may be arranged on the first gate line 130*a*. Although the input contact area 150 has a very thin thickness in FIG. 9B for convenience of drawing, the input contact area 150 may have a greater thickness.

Figure 10:
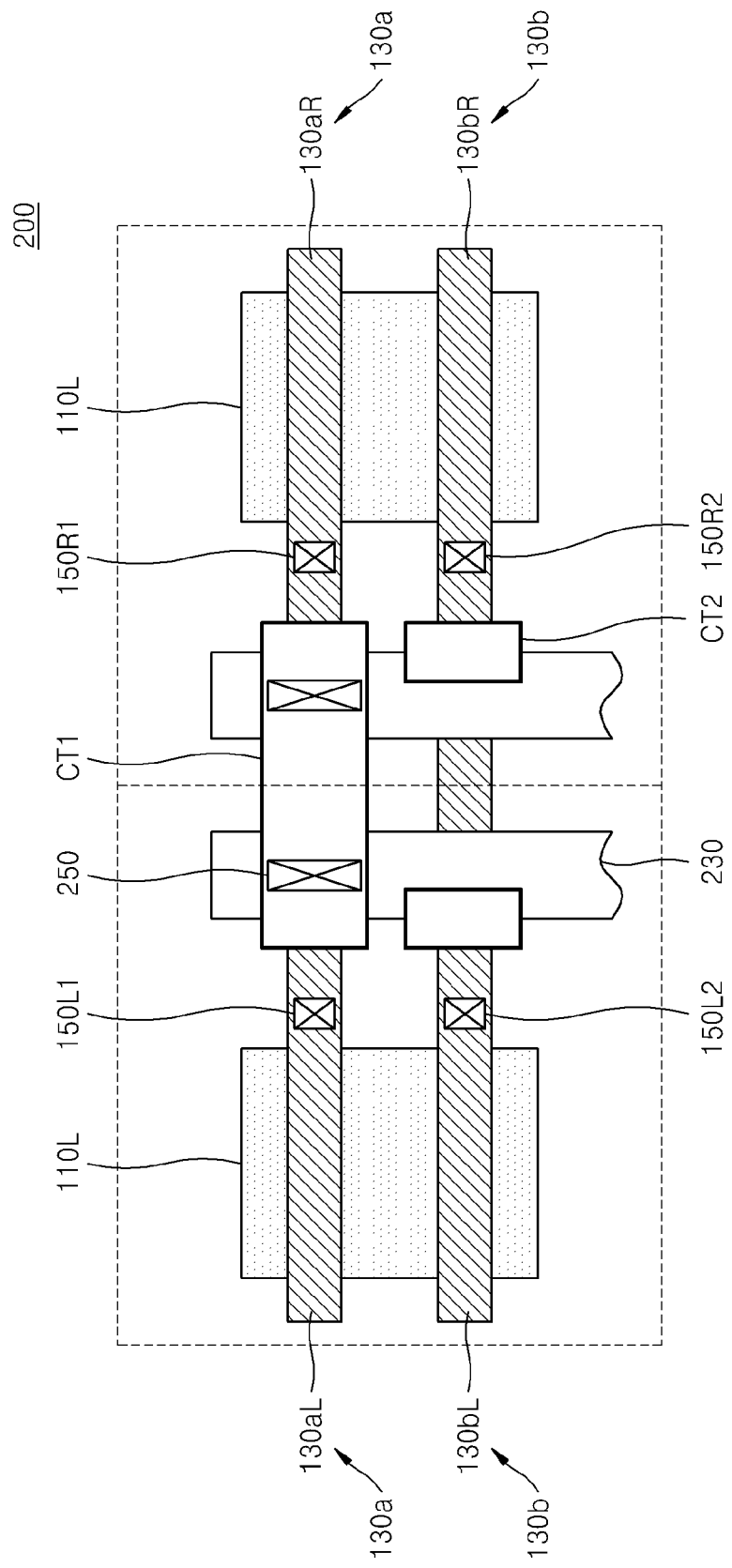
FIG. 10 is a layout of a semiconductor integrated circuit according to another exemplary embodiment.

FIG. 10 is a layout of a semiconductor integrated circuit 200 according to another exemplary embodiment.

Referring to FIG. 10, in the semiconductor integrated circuit 200, first and second gate lines 130*a* and 130*b* may be arranged by crossing left and right active areas 110L and 110R. In detail, first and second left gate lines 130*a*L and 130*b*L may be arranged by crossing the left active area 110L, and first and second right gate lines 130*a*R and 130*b*R may be arranged by crossing the right active area 110R.

First and second left contact areas 150L1 and 150L2 may be formed on right overhead parts of the first and second left gate lines 130*a*L and 130*b*L, respectively, and first and second right contact areas 150R1 and 150R2 may be formed on left overhead parts of the first and second right gate lines 130*a*R and 130*b*R, respectively. Two conductive areas 230 may be arranged between these contact areas 150L1, 150L2, 150R1, and 150R2 by orthogonally crossing the first and second gate lines 130*a* and 130*b*. In detail, the two conductive areas 230 may be arranged between the first left contact area 150L1 and the first right contact area 150R1 and between the second left contact area 150L2 and the second right contact area 150R2, and a conductive contact area 250 may be arranged on each of the two conductive areas 230. Although the two conductive areas 230 are arranged in FIG. 10, the current exemplary embodiment is not limited thereto. For example, one conductive area 230 or three or more conductive areas 230 may be arranged. Each of the conductive areas 230 may be a well pick-up area for applying a bias voltage to a well. However, the conductive areas 230 are not limited to the well pick-up area.

In the semiconductor integrated circuit 200 having the structure shown in FIG. 10, a second cutting area CT2 on the second gate line 130*b* may be arranged using the above-described arrangement process. For example, the second cutting area CT2 may be arranged using the move tool and the duplication tool. In addition, a first cutting area CT1 on the first gate line 130*a* may be arranged using the move tool and the extension tool. However, an exceptional method different from the principles described above is applied to the arrangement of the first cutting area CT1.

In more detail, when the two conductive contact areas 250 are taken into account, it is more general that the first cutting area CT1 is arranged between the two conductive contact areas 250, and thus, it is not excluded that the first cutting area CT1 is arranged between the two conductive contact areas 250. However, when a distance between the two conductive contact areas 250 is short, it may be impossible to arrange the first cutting area CT1, and in this case, the first cutting area CT1 may be extended and arranged to include the two conductive contact areas 250 as described in the current exemplary embodiment. In addition, in terms of parasitic capacitance, it may be more advantageous to arrange the first cutting area CT1 by including the two conductive contact areas 250 therein than to arrange the first cutting area CT1 between the two conductive contact areas 250.

Although only relationships with other device areas not overlaid vertically based on a substrate surface have been considered in the foregoing exemplary embodiments, relationships with device areas overlaid vertically based on a substrate surface are also considered in the current exemplary embodiment. As a result, for the vertically overlaid device areas, the foregoing arrangement process rules are observed as they are, however, when a cutting area cannot be arranged due to an overlaid device area, or when a structure in which a cutting area includes overlaid device areas is more effective to reduce a parasitic capacitance, the cutting area may include overlaid device areas.

Figure 11:
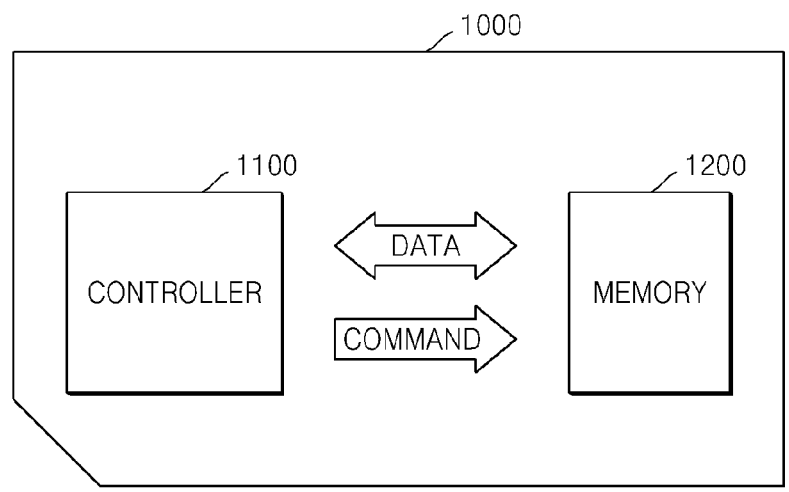
FIG. 11 is a schematic diagram of a memory card including a semiconductor integrated circuit according to an exemplary embodiment.

FIG. 11 is a schematic diagram of a memory card 1000 including a semiconductor integrated circuit according to an exemplary embodiment.

Referring to FIG. 11, the memory card 1000 may be arranged so that a controller 1100 and a memory 1200 exchange electrical signals with each other. For example, when the controller 1100 sends a command, the memory 1200 may send data back.

The controller 1100 and the memory 1200 may include a semiconductor integrated circuit according to the exemplary embodiments conforming to the technical spirit. In detail, at least one of a plurality of semiconductor devices included in the controller 1100 and the memory 1200 may include semiconductor integrated circuits, e.g., transistors, in which the arrangement of a cutting area is optimized using the arrangement process according to the above-described exemplary embodiments, thereby minimizing an overhead in a conductive line and thus minimizing the generation of a parasitic capacitance.

The memory card 1000 may form various types of memory cards such as a memory stick card, a Smart Media (SM) card, a Secure Digital (SD) card, a mini-SD card, a Multimedia Card (MMC), etc.

Figure 12:
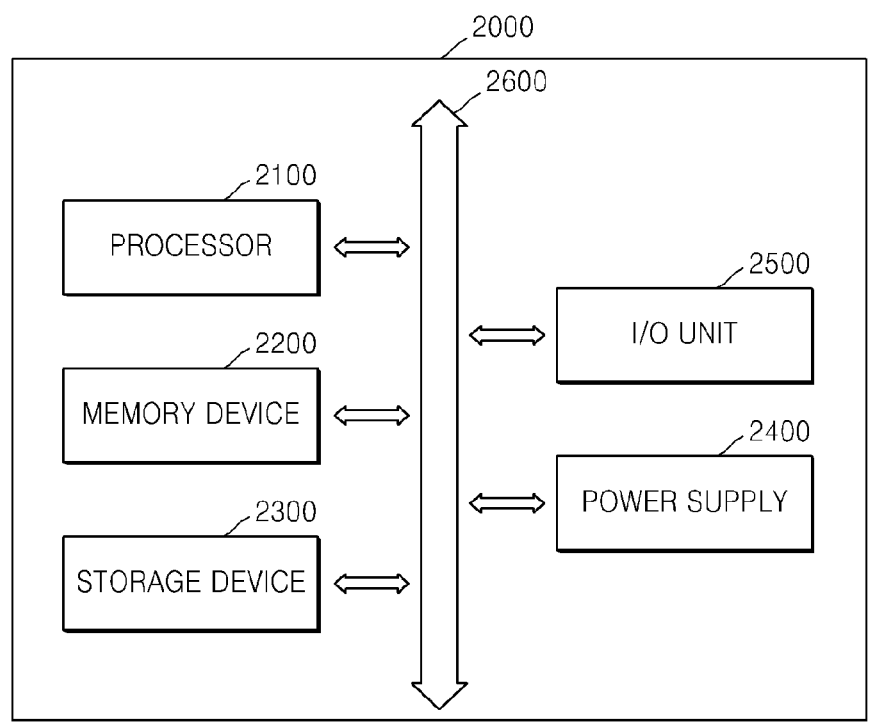
FIG. 12 is a schematic diagram of a computing system including a semiconductor integrated circuit according to an exemplary embodiment.

FIG. 12 is a schematic diagram of a computing system 2000 including a semiconductor integrated circuit according to an exemplary embodiment.

Referring to FIG. 12, the computing system 2000 may include a processor 2100, a memory device 2200, a storage device 2300, a power supply 2400, and an input/output (I/O) unit 2500. Although not shown, the computing system 2000 may further include ports for communicating with a video card, a sound card, a memory card, and a Universal Serial Bus (USB) device, or communicating with other electronic devices.

The processor 2100, the memory device 2200, the storage device 2300, the power supply 2400, and the I/O unit 2500 included in the computing system 2000 may include a semiconductor integrated circuit according to the exemplary embodiments conforming to the technical spirit of the inventive concept. In detail, at least one of a plurality of semiconductor devices included in the processor 2100, the memory device 2200, the storage device 2300, the power supply 2400, and the I/O unit 2500 may include semiconductor integrated circuits, e.g., transistors, in which the arrangement of a cutting area is optimized using the arrangement process according to the above-described exemplary embodiments, thereby minimizing an overhead in a conductive line and thus minimizing the generation of a parasitic capacitance.

The processor 2100 may perform specific computations or tasks. According to an exemplary embodiment, the processor 2100 may be a microprocessor or a Central Processing Unit (CPU). The processor 2100 may communicate with the memory device 2200, the storage device 2300, and the I/O unit 2500 via a bus 2600 including an address bus, a control bus, and a data bus. According to an exemplary embodiment, the processor 2100 may be connected to an extended bus, such as a Peripheral Component Interconnect (PCI) bus.

The memory device 2200 may store data required to operate the computing system 2000. For example, the memory device 2200 may embodied with Dynamic Random Access Memory (DRAM), mobile DRAM, Static RAM (SRAM), Parameter RAM (PRAM), Ferroelectric RAM (FRAM), Resistive RAM (RRAM), and/or Magnetoresistive RAM (MRAM). The storage device 2300 may include a solid state drive, a hard disk drive, and a CD-ROM.

The I/O unit 2500 may include an input means, such as a keyboard, a keypad, and a mouse, and an output means, such as a printer and a display. The power supply 2400 may supply an operating voltage required to operate the computing system 2000.

A semiconductor integrated circuit according to the exemplary embodiments may be embodied with various types of packages. For example, at least some components of the semiconductor integrated circuit may be packaged using packages, such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and Wafer-level processed Stack Package (WSP).

As discussed above, method of designing a semiconductor integrated circuit, a semiconductor integrated circuit according to the designing method, and a fabricating method thereof according to the exemplary embodiments, may minimize an overhead in a gate line by automatically arranging a cutting area cutting a conductive line, especially a gate line, using an arrangement process, thereby minimizing the generation of a parasitic capacitance.

In addition, the method of designing a semiconductor integrated circuit according to the exemplary embodiments may easily minimize an overhead in a gate line without defining an additional design rule or applying an additional OPC rule by the arrangement process automatically arranging the cutting area using at least one of a break tool, a move tool, a moveback tool, an extension tool, and a duplication tool.

In addition, the method of designing a semiconductor integrated circuit according to the exemplary embodiments may minimize the parasitic capacitance due to the decrease of the overhead in the gate line, thereby significantly improving device performance, e.g., operational performance such as an operational speed or dynamic power consumption.

While exemplary embodiments been particularly shown and described, it will be understood that various changes in form and details may be made therein without departing from the spirit and scope of the following claims.

What is claimed is:

1. A method of designing a semiconductor integrated circuit having a FinFET architecture in order to reduce a parasitic capacitance of one or more conductive lines including a first conductive line, the method comprising:
    performing a pre-simulation of the semiconductor integrated circuit to be designed;
    designing a layout of components of the semiconductor integrated circuit based on a result of the pre-simulation, the components comprising first and second device areas and the first conductive line extending across the first and second device areas, the first conductive line being a gate line;
    modifying, using a computer, a first cutting area, that is arranged between the first and second device areas and electrically cuts the first conductive line, according to at least one design rule to minimize an overhead of the first conductive line created by the first cutting area; and
    fabricating the semiconductor integrated circuit based on the layout.

2. The method of claim 1, wherein the overhead is minimized to reduce a parasitic capacitance of the first conductive line.

3. The method of claim 1, wherein the modifying the first cutting area comprises at least one of:
    moving the first cutting area along the first conductive line,
    extending a width of the first cutting area, and
    duplicating the first cutting area to create a second cutting area and arranging the second cutting area along the first conductive line.

4. The method of claim 3, wherein the moving the first cutting area comprises moving the first cutting area along the first conductive line based on a predetermined distance between the first cutting area and one of the first and second device areas.

5. The method of claim 1, wherein the design rule specifies at least one of a minimum distance separating the first cutting area from the first and second device areas, a minimum distance separating the first cutting area from a contact area, and a minimum distance separating the first cutting area from a third device area.

6. The method of claim 1, wherein the first cutting area cuts the one or more conductive lines including the first conductive line and extending in parallel to each other, and
    wherein the method further comprises, prior to the modifying the first cutting area, breaking the first cutting area into a plurality of cutting areas, each of the plurality of cutting areas cutting a respective conductive line of the one or more conductive lines.

7. The method of claim 6, wherein the modifying the first cutting area comprises modifying the plurality of cutting areas according to the at least one design rule to minimize overheads of the one or more conductive lines created by the plurality of cutting areas, and
    wherein the modified cutting areas have at least one of different widths and different positions along the respective conductive lines.

8. The method of claim 1, wherein the modifying the first cutting area comprises:
    moving the first cutting area in a first direction along the first conductive line so that the first cutting area is a preset distance from the first device area according to the design rule; and
    moving the first cutting area in a second direction opposite to the first direction when a distance between the first cutting area and a contact area or a device area other than the first and second device areas violates the design rule as a result of the moving the first cutting area in the first direction.

9. The method of claim 1, wherein the first device area is a first active area, and the second device area is a second active area.

10. A method of designing a semiconductor integrated circuit having a FinFET architecture in order to reduce a parasitic capacitance of one or more conductive lines including a first conductive line, the method comprising:
    setting a first cutting area of the first conductive line extending across first and second device areas at an initial position between the first and second device areas on the first conductive line according to a design rule, the first cutting area electrically cutting the first conductive line, the first conductive line being a gate line, each of the first and second device areas forming an NMOS transistor or a PMOS transistor;

extending, using a computer, a width of the first cutting area, or duplicating the first cutting area and arranging a second cutting area that is duplicate of the first cutting area on the first conductive line, to minimize an overhead in the first conductive line created by the first cutting area; and fabricating the semiconductor integrated circuit based on at least one of a result of the setting the first cutting area, and either a result of either the extending the width of the first cutting area or the duplicating the first cutting area and the arranging the second cutting area.

11. The method of claim 10, further comprising, after the setting the setting the first cutting area, moving the first cutting area in a first direction along the first conductive line so that the first cutting area is a preset distance from the first device area according to the design rule.

12. The method of claim 11, further comprising, after the moving the first cutting area in the first direction, moving the first cutting area in a second direction opposite to the first direction when a distance between the first cutting area and a contact area or a device area other than the first and second device areas violates the design rule as a result of the moving the first cutting area in the first direction.

13. The method of claim 10, wherein the first cutting area cuts the one or more conductive lines including the first conductive line and extending in parallel to each other, and
wherein the method further comprises, prior to the moving the first cutting area in the first direction, breaking the first cutting area into a plurality of cutting areas, each of the plurality of cutting areas cutting a respective conductive line of the one or more conductive lines.

14. The method of claim 10, the extending the width of the first cutting area or the duplicating the first cutting area and arranging the second cutting area comprises:
determining whether to perform the extending the width of the first cutting area or the duplicating the first cutting area and arranging the second cutting area, based on a distance between the first and second device areas;
performing the extending the width of the first cutting area or the duplicating the first cutting area and arranging the second cutting area based on a result of the determining;
verifying that the extending width of the first cutting area or the duplicating the first cutting area and arranging the second cutting area satisfies the design rule; and
if the extending width of the first cutting area is performed and does not satisfy the design rule, adjusting the width of the first cutting area so that the design rule is satisfied; and
if the duplicating the first cutting area and arranging the second cutting area does not satisfy the design rule, moving at least one of the first and second cutting areas so that the design rule is satisfied.

15. The method of claim 14, wherein the design rule specifies at least one of a minimum distance separating the first and second cutting areas from the first and second device areas, a minimum distance separating the first and second cutting areas from contact areas, and a minimum distance separating the first and second cutting areas from a third device area.

16. The method of claim 14, wherein the determining whether to perform the extending the width of the first cutting area comprises determining that the extending the width of the first cutting area is to be performed if a total distance (Dtot) between the first and second device areas satisfies the following equation:

$$Ds*2+W1 < Dtot \le Ds*2+W1*3,$$

wherein Ds is the preset distance between the first cutting area and the first and second device areas, and W1 is the width of the first cutting area.

17. The method of claim 14, wherein the determining whether to perform the duplicating the first cutting area and arranging the second cutting area comprises determining whether a total distance between the first and second device areas (Dtot) satisfies the following equation:

$$Dtot \ge Ds*2+W1*3,$$

wherein Ds is the preset distance between the first cutting area and the first and second device areas, and W1 is the width of the first cutting area.

18. The method of claim 10, further comprising:
performing a pre-simulation of the semiconductor integrated circuit;
performing a post-simulation based on the modified first cutting area; and
fabricating the semiconductor integrated circuit based on the modified first cutting area.

19. A method of manufacturing a semiconductor integrated circuit having a FinFET architecture, the method comprising:
performing a pre-simulation of the semiconductor integrated circuit to be designed;
designing a layout of components of the semiconductor integrated circuit based on a result of the pre-simulation, the components comprising first and second device areas and a first conductive line extending across the first and second device areas;
modifying a first cutting area, that is arranged between the first and second device areas and electrically cuts the first conductive line, according to at least one design rule to minimize an overhead of the first conductive line created by the first cutting area;
performing a post-simulation based on the layout including the modified first cutting area; and
fabricating the semiconductor integrated circuit based on the layout.

20. The method of claim 19, wherein the fabricating the semiconductor integrated circuit comprises:
preparing data of the layout;
performing optical proximity correction to produce a corrected layout in which reflecting errors due to an optical proximity effect are corrected;
producing a mask according to the corrected layout; and
forming the semiconductor integrated circuit on a wafer using the mask.

21. The method of claim 19, wherein the overhead is minimized to reduce a parasitic capacitance of the first conductive line.

22. The method of claim 19, wherein the modifying the first cutting area comprises at least one of:
moving the first cutting area along the first conductive line,
extending a width of the first cutting area, and
duplicating the first cutting area to create a second cutting area and arranging the second cutting area along the first conductive line.

23. The method of claim 22, wherein the modifying the first cutting area comprises moving the first cutting area along the first conductive line based on a predetermined distance between the first cutting area and one of the first and second device areas.

24. The method of claim 19, wherein the design rule specifies at least one of a minimum distance separating the first cutting area from the first and second device areas, a minimum distance separating the first cutting area from contact areas arranged between the first and second device areas, and a minimum distance separating the first cutting area from a third device area.

25. The method of claim 19, wherein the first cutting area cuts the one or more conductive lines including the first conductive line and extending in parallel to each other, and
wherein the method further comprises, prior to the modifying the first cutting area, breaking the first cutting area into a plurality of cutting areas, each of the plurality of cutting areas cutting a respective conductive line of the one or more conductive lines.

* * * * *